(12) United States Patent
Kim et al.

(10) Patent No.: US 10,573,852 B2
(45) Date of Patent: Feb. 25, 2020

(54) DISPLAY DEVICE INCLUDING A REINFORCING MEMBER

(71) Applicant: SAMSUNG DISPLAY CO., LTD., Yongin-si, Gyeonggi-Do (KR)

(72) Inventors: Byoung Yong Kim, Seoul (KR); Jeong Ho Hwang, Cheonan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/132,981

(22) Filed: Sep. 17, 2018

(65) Prior Publication Data

US 2019/0181388 A1 Jun. 13, 2019

(30) Foreign Application Priority Data

Dec. 13, 2017 (KR) .......................... 10-2017-0171233

(51) Int. Cl.
*H01L 27/32* (2006.01)
*H01L 23/00* (2006.01)
(Continued)

(52) U.S. Cl.
CPC .............. *H01L 51/56* (2013.01); *G09F 9/301* (2013.01); *H01L 24/06* (2013.01); *H01L 27/3246* (2013.01); *H01L 27/3276* (2013.01); *H01L 51/0097* (2013.01); *H01L 51/105* (2013.01); *H01L 51/107* (2013.01); *G09G 2310/0264* (2013.01); *H01L 24/13* (2013.01); *H01L 24/16* (2013.01); *H01L 2224/1318* (2013.01); *H01L 2224/13123* (2013.01); *H01L 2224/13124* (2013.01); *H01L 2224/13139* (2013.01); *H01L 2224/13144* (2013.01);
(Continued)

(58) Field of Classification Search
CPC ....................................................... H01L 24/06
See application file for complete search history.

(56) References Cited

U.S. PATENT DOCUMENTS 10,229,963 B1 * 3/2019 Qi ........................ G02F 1/13452
2013/0342429 A1 * 12/2013 Choi ....................... H05K 13/00
345/30
(Continued)

FOREIGN PATENT DOCUMENTS

KR    1020140064166    5/2014
KR    1020170106590    9/2017

*Primary Examiner* — William A Harriston
(74) *Attorney, Agent, or Firm* — F. Chau & Associates, LLC

(57) ABSTRACT

A display device includes a flexible base layer including a first portion and a second portion. A display unit is disposed on a first surface of the first portion. The display unit includes a light emitting element. A driving circuit is disposed on a first surface of the second portion. The driving circuit includes a driving chip. A first support member is disposed on a second surface of the first portion opposite the first surface. A second support member is disposed on a second surface of the second portion. The second support member includes a first opening overlapping the driving circuit. The second surface of the second portion is on an opposite side of the second portion from the first surface of the second portion. A first reinforcing member is disposed in the first opening. The first reinforcing member includes a different material from the second support member.

18 Claims, 22 Drawing Sheets

(51) Int. Cl.
| | | |
|---|---|---|
| | *H01L 51/56* | (2006.01) |
| | *H01L 51/00* | (2006.01) |
| | *H01L 51/10* | (2006.01) |
| | *G09F 9/30* | (2006.01) |

(52) U.S. Cl.
CPC .............. *H01L 2224/13155* (2013.01); *H01L 2224/13164* (2013.01); *H01L 2224/13166* (2013.01); *H01L 2224/13169* (2013.01); *H01L 2224/13171* (2013.01); *H01L 2224/13178* (2013.01); *H01L 2224/13181* (2013.01); *H01L 2224/13184* (2013.01); *H01L 2224/16225* (2013.01); *H01L 2224/80205* (2013.01); *H01L 2924/14* (2013.01)

(56) References Cited

U.S. PATENT DOCUMENTS

| | | | | |
|---|---|---|---|---|
| 2014/0140029 | A1* | 5/2014 | Kim | H05K 3/323 |
| | | | | 361/783 |
| 2014/0183473 | A1* | 7/2014 | Lee | H01L 51/0097 |
| | | | | 257/40 |
| 2014/0307396 | A1* | 10/2014 | Lee | H05K 1/028 |
| | | | | 361/749 |
| 2016/0174304 | A1* | 6/2016 | Kim | H05B 33/04 |
| | | | | 313/511 |
| 2016/0179229 | A1* | 6/2016 | Ahn | G06F 3/041 |
| | | | | 345/173 |
| 2017/0108721 | A1* | 4/2017 | Bae | G02B 6/0083 |
| 2017/0199619 | A1 | 7/2017 | Lee et al. | |
| 2017/0263887 | A1* | 9/2017 | Han | H01L 27/3276 |
| 2018/0182983 | A1* | 6/2018 | Bae | H01L 25/167 |
| 2019/0094641 | A1* | 3/2019 | Choi | G02F 1/136286 |

\* cited by examiner

DISPLAY DEVICE INCLUDING A REINFORCING MEMBER

CROSS-REFERENCE TO RELATED APPLICATION

This application claims priority under 35 U.S.C. § 119 to Korean Patent Application No. 10-2017-0171233 filed on Dec. 13, 2017, in the Korean Intellectual Property Office, the disclosure of which is incorporated by reference herein in its entirety.

1. Technical Field

Exemplary embodiments of the present invention relate to a display device, and more particularly to a display device including a reinforcing member.

2. Discussion of Related Art

A display device may visually display data. Such a display device may include a substrate partitioned into a display area and a non-display area. In the display area, a display unit may be disposed on the substrate, and in the non-display area, a pad may be disposed on the substrate. A driving circuit may be disposed on the pad. The driving circuit may transmit a driving signal to the display unit.

A display device may relatively slim and may be formed by applying a flexible material such as plastic to a substrate. A method of reducing an area of a visually-recognized non-display area may include bending at least a part of a display device.

SUMMARY

An exemplary embodiment of the present invention provides a display device in which the area of a non-display area is reduced.

An exemplary embodiment of the present invention provides a display device having increased reliability.

According to an exemplary embodiment of the present invention, a display device includes a flexible base layer including a first portion and a second portion adjacent to the first portion. A display unit is disposed on a first surface of the first portion. The display unit includes a light emitting element. A driving circuit is disposed on a first surface of the second portion. The driving circuit includes a driving chip. A first support member is disposed on a second surface of the first portion. The second surface of the first portion is on an opposite side of the first portion from the first surface of the first portion. A second support member is disposed on a second surface of the second portion. The second support member includes a first opening overlapping the driving circuit. The second surface of the second portion is on an opposite side of the second portion from the first surface of the second portion. A first reinforcing member is disposed in the first opening. The first reinforcing member includes a different material from the second support member.

According to an exemplary embodiment of the present invention, a display device includes a flexible base layer including a first portion and a second portion adjacent to the first portion. A display unit is disposed on the first portion. A first pad is disposed on the second portion. The first pad includes a first conductive material. A driving circuit includes a driving chip disposed on the second portion and a first terminal disposed between the driving chip and the first pad. The first terminal includes a second conductive material different from the first conductive material. The first pad and the first terminal are in direct contact with each other. The first pad includes a first pad region including the first conductive material and not including the second conductive material. The first pad includes a second pad region disposed between the first pad region and a contact interface between the first pad and the first terminal. The second pad region includes the first conductive material and the second conductive material.

According to an exemplary embodiment of the present invention, a display device includes a flexible base layer including a first portion, a bending portion adjacent to the first portion and a second portion adjacent to the bending portion. A display unit is disposed on the first portion of the base layer. A first pad is disposed on the second portion. The first pad is connected to a first wiring. A first terminal is disposed on the first pad. A second pad is disposed on the second portion and is spaced apart from the first pad. The second pad is connected to a second wiring. A second terminal is disposed on the second pad. A driving chip is disposed on the first terminal and the second terminal. A reinforcing member is disposed on the second portion on an opposite side of the second portion from the driving chip. The reinforcing member overlaps the driving chip.

BRIEF DESCRIPTION OF THE DRAWINGS

The above and other aspects and features of the present invention will become more apparent by describing in detail exemplary embodiments thereof with reference to the accompanying drawings, in which.

DETAILED DESCRIPTION OF THE EMBODIMENTS

Figure 1:
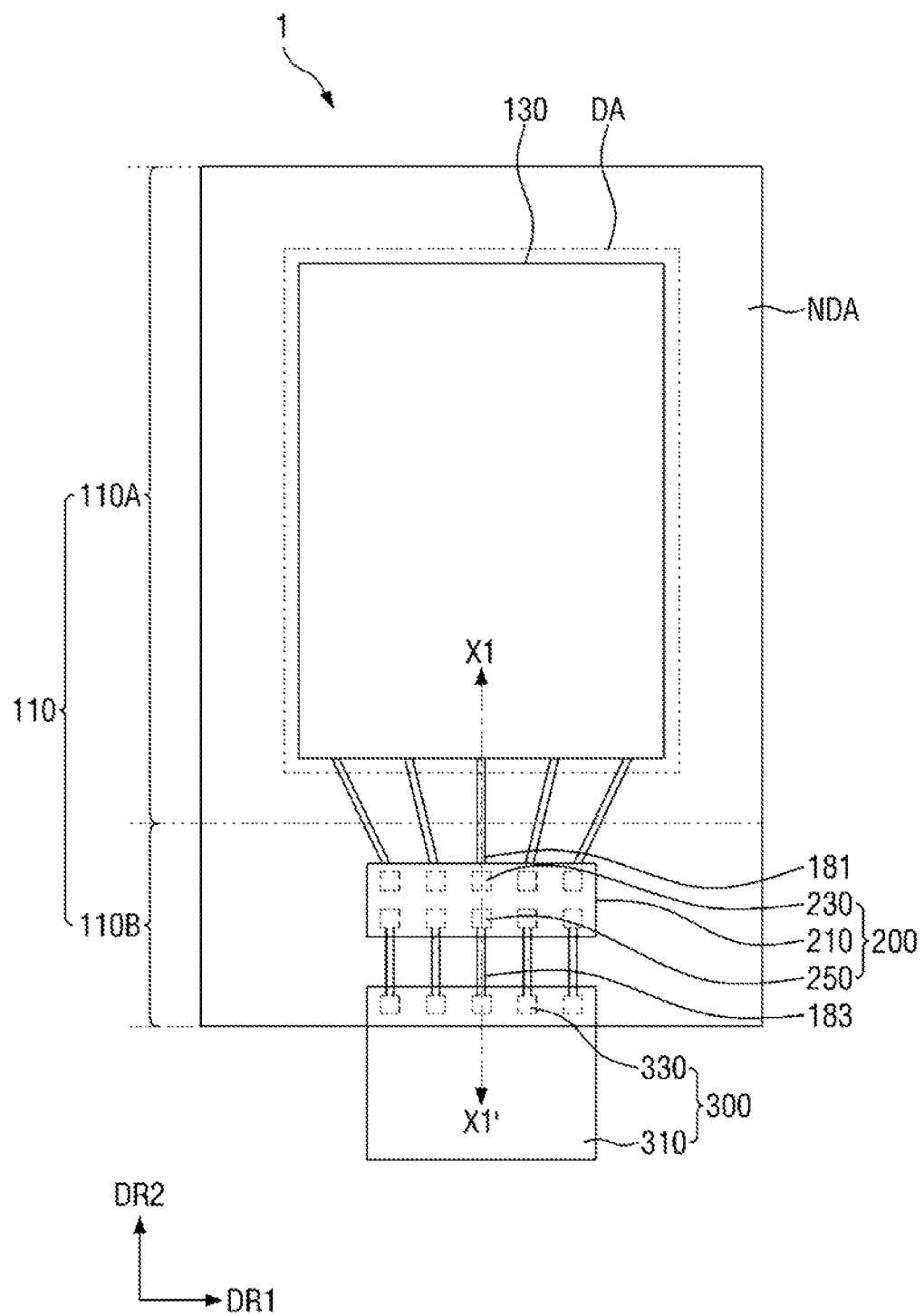
FIG. 1 is a plan view of a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein. Like reference numerals may refer to like elements throughout the specification and drawings.

As used herein, the singular forms "a", "an" and "the" may include the plural forms as well, unless the context clearly indicates otherwise.

It will be understood that when a component, such as a layer, a film, a region, or a plate, is referred to as being "on" another component, the component may be directly on the other component or intervening components may be present.

It will be understood that although the terms "first" and "second" may be used herein to describe various components, these components should not be limited by these terms.

Figure 2:
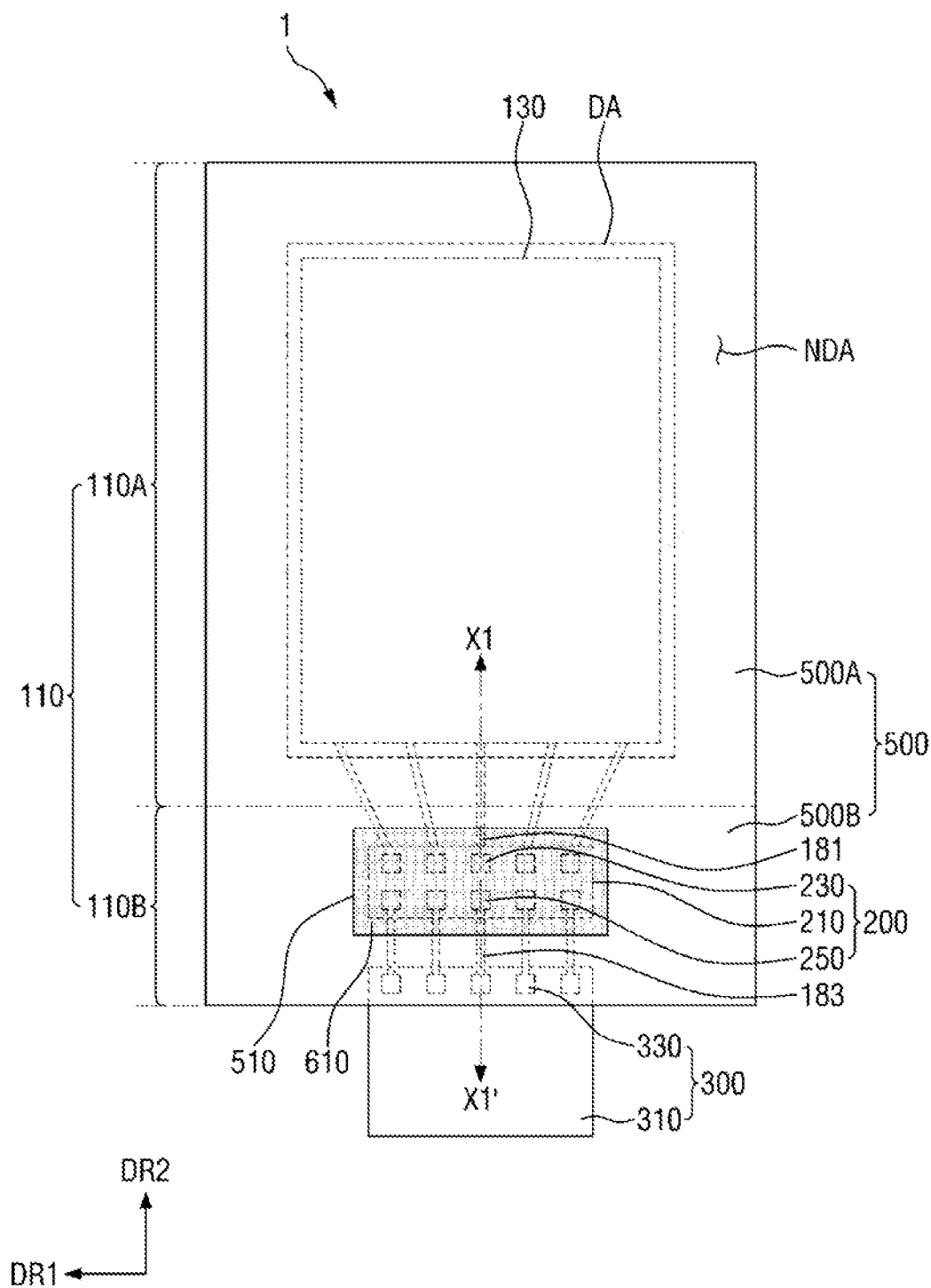
FIG. 2 is a rear view of the display device of FIG. 1.
Figure 3:
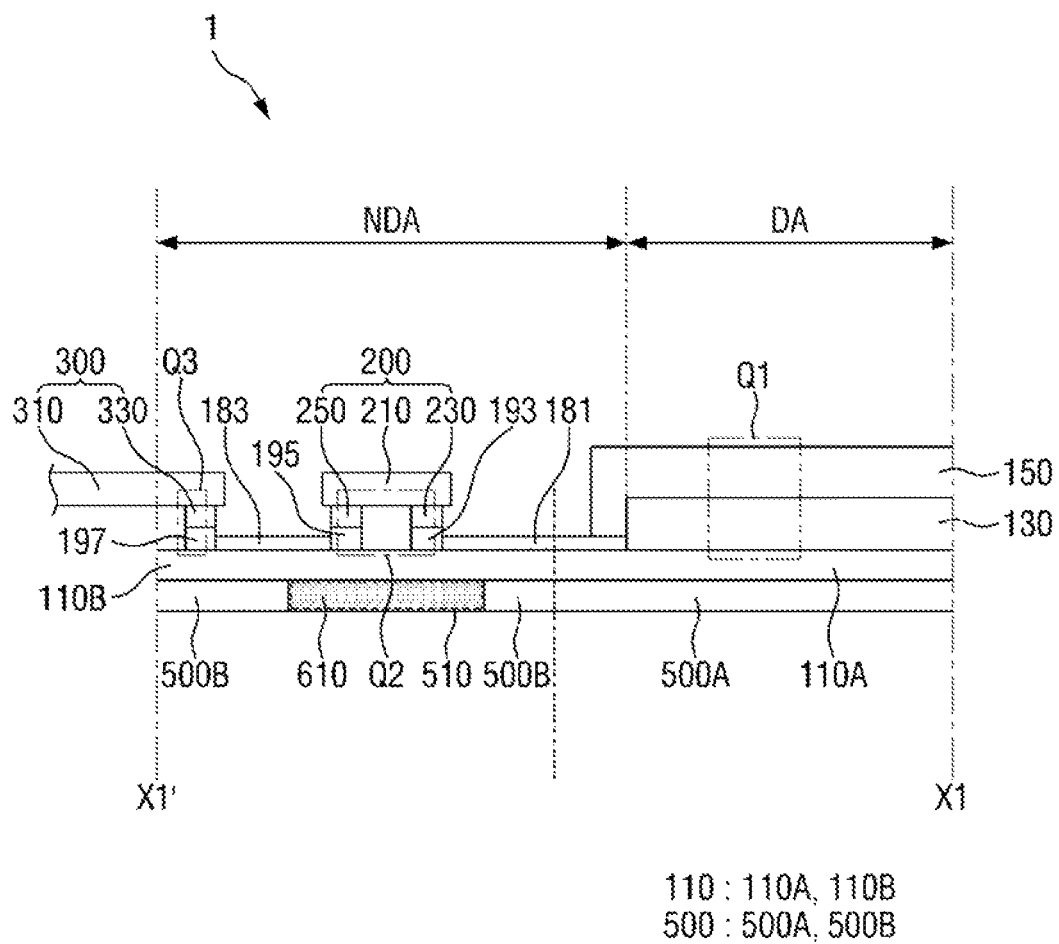
FIG. 3 is a cross-sectional view taken along the line X1-X1' in FIGS. 1 and 2.
Figure 4:
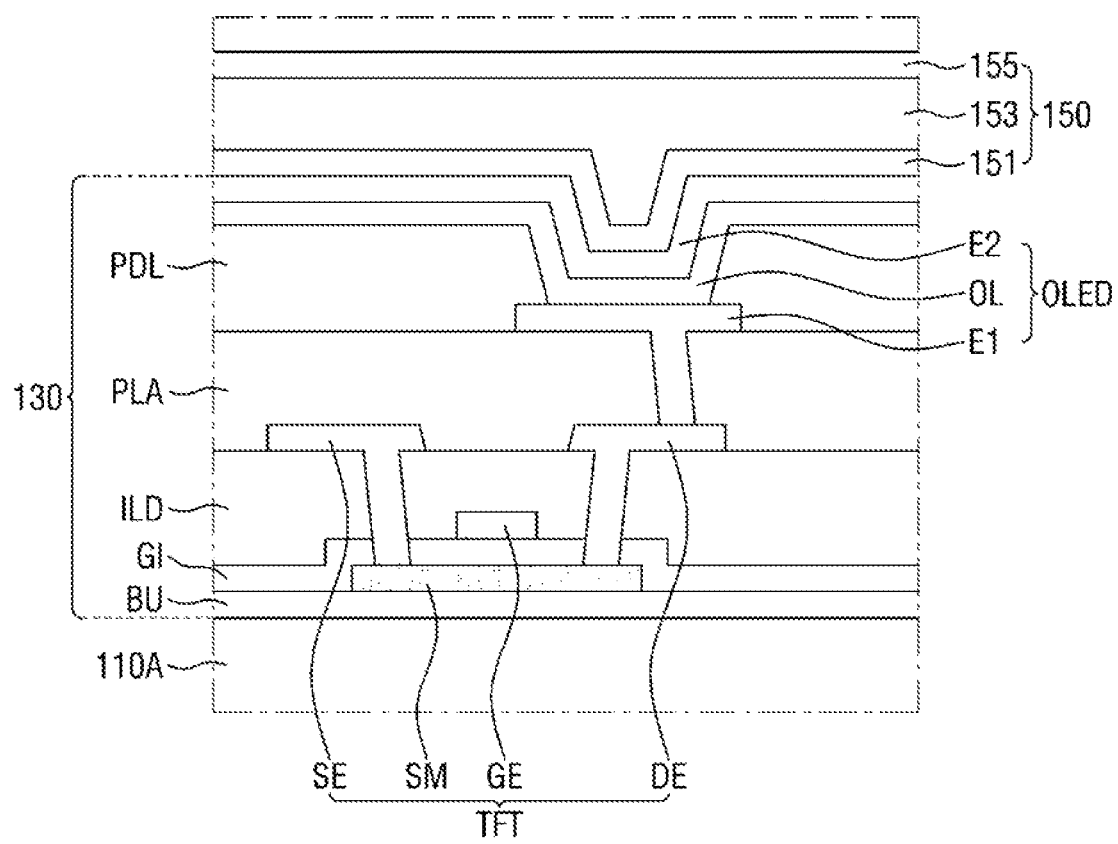
FIG. 4 is an enlarged view of Q1 in FIG. 3.
Figure 5:
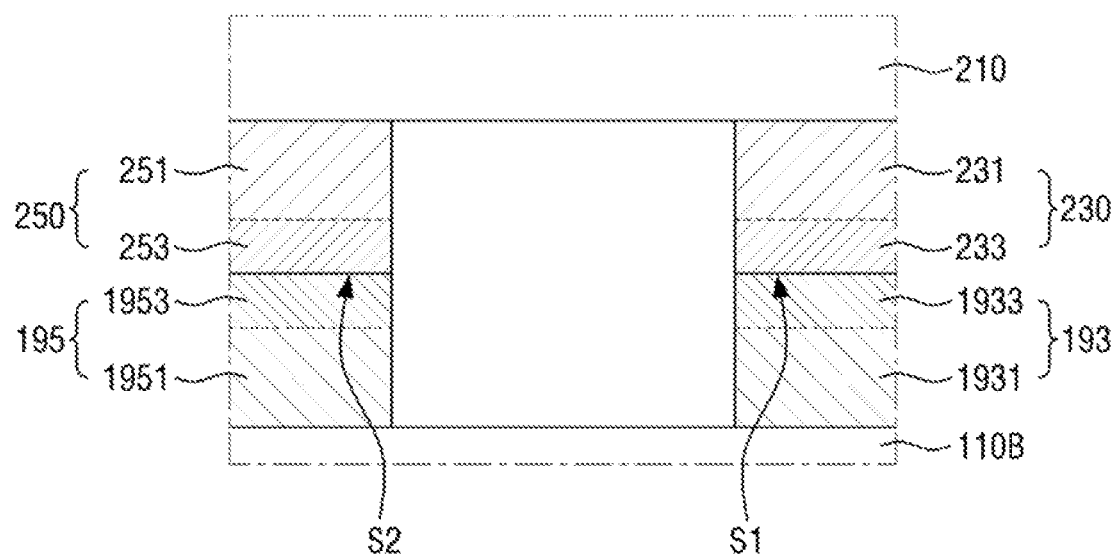
FIG. 5 is an enlarged view of Q2 in FIG. 3.
Figure 6:
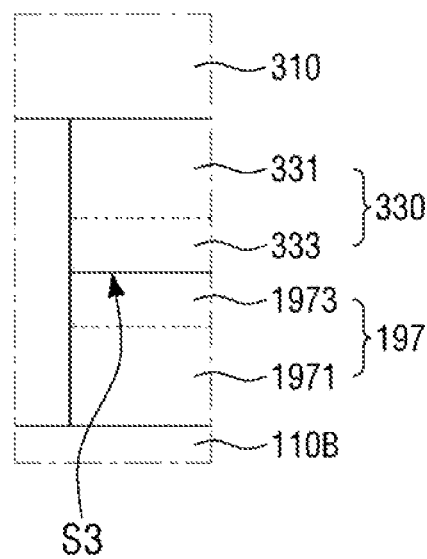
FIG. 6 is an enlarged view of Q3 in FIG. 3.

FIG. 1 is a plan view of a display device according to an exemplary embodiment of the present invention. FIG. 2 is a rear view of the display device of FIG. 1. FIG. 3 is a cross-sectional view taken along the line X1-X1' in FIGS. 1 and 2. FIG. 4 is an enlarged view of Q1 in FIG. 3. FIG. 5 is an enlarged view of Q2 in FIG. 3. FIG. 6 is an enlarged view of Q3 in FIG. 3.

Referring to FIGS. 1 to 6, a display device 1 according to an exemplary embodiment of the present invention may include a display area DA and a non-display area NDA adjacent to the display area DA. As an example, the non-display area NDA may surround the DA (e.g., on four sides of the display area DA in a plan view). Alternatively, the non-display area NDA may be arranged at less than four sides of the display area DA in a plan view. The display area DA may be an area where an image is displayed, and the non-display area NDA may be an area where an image is not displayed.

The display device 1 may include a flexible base layer 110, a display unit 130, a driving circuit 200, and a support member 500. The display device 1 may include a reinforcing member 610, and may include a circuit board unit 300 and an encapsulation unit 150.

The flexible base layer 110 may include an insulating substrate. In an exemplary embodiment of the present invention, the flexible base layer 110 may include a flexible polymer material. For example, the polymer material may be polyimide (PI), polyethersulphone (PES), polyacrylate (PA), polyarylate (PAR), polyetherimide (PEI), polyethylenenapthalate (PEN), polyethyleneterepthalat (PET), polyphenylenesulfide (PPS), polyallylate, polycarbonate (PC), cellulosetriacetate (CAT), cellulose acetate propionate (CAP), or a combination thereof.

The flexible base layer 110 may include a first portion 110A and a second portion 110B. The second portion 110B may be adjacent to the first portion 110A. The display area DA in which the display unit 130 is disposed may be defined in the first portion 110A, and a part of the non-display area NDA may be defined in the first portion 110A. Another part of the non-display area NDA may be defined in the second portion 110B, and the driving circuit 200 may be disposed in the second portion 110B. In an exemplary embodiment of the present invention, the first portion 110A and the second portion 110B may be in a substantially flat state. Herein, the term "substantially flat" may include a state of partially convex or partially concave as well as fully flat. A boundary between the first portion 110A and the second portion 110B may be flexible, and may be bent into a curved state. Thus, the first portion 110A and the second portion 110B may be included in a curved display panel that may be in a flat state or a curved state, and may be bendable at the boundary between the first portion 110A and the second portion 110B.

The display unit 130 may be located on the first portion 110A of the flexible base layer 110, and the encapsulation unit 150 may be located on the display unit 130.

The display unit 130 may include a thin film transistor TFT, which may be a switching element, and a light emitting diode OLED connected to the thin film transistor TFT. The display unit 130 may include a buffer layer BU, a gate insulating film GI, an interlayer insulating film ILD, a planarization film PLA, a pixel defining film PDL, a gate line, and a data line.

The buffer layer BU may be disposed on the first portion 110A of the flexible base layer 110. The buffer layer BU can prevent the diffusion of impurity ions, may prevent the penetration of moisture or external air, and may perform a surface planarization function. The buffer layer BU may include silicon nitride, silicon oxide, or silicon oxynitride. In an exemplary embodiment of the present invention, the buffer layer BU may be omitted (e.g., depending on process conditions).

A semiconductor layer SM may be disposed on the buffer layer BU. The semiconductor layer SM may include monocrystalline silicon, low-temperature polycrystalline silicon, or amorphous silicon. However, exemplary embodiments of the present invention are not limited thereto, and in an exemplary embodiment of the present invention, the semiconductor layer SM may include ITZO (an oxide including indium, tin, and titanium) or IGZO (an oxide including indium, gallium, and tin).

A gate insulating film GI may be disposed on the semiconductor layer SM. The gate insulating film GI may include an inorganic material, and may include, for example, silicon oxide, silicon nitride, silicon oxynitride, aluminum oxide, tantalum oxide, hafnium oxide, zirconium oxide, or titanium oxide.

A gate electrode GE may be disposed on the gate insulating film GI. The gate electrode GE may be connected to a gate line extending along a first direction DR1. The gate electrode GE may receive a gate signal such as a gate voltage.

An interlayer insulating film ILD may be disposed on the gate electrode GE. The interlayer insulating film ILD may include an organic material or an inorganic material, and may include a single-layered film or a multi-layered film including at least two stacked layers. The stacked layers may include a same material or different materials from each other.

A source electrode SE and a drain electrode DE may be disposed on the interlayer insulating film ILD. Each of the source electrode SE and the drain electrode DE may penetrate the interlayer insulating film ILD and the gate insulating film GI to be connected to the semiconductor layer. The source electrode SE may be connected to a data line extending along a second direction DE2. The source electrode SE may receive a data signal such as a data voltage.

The semiconductor layer SM, the gate electrode GE, the source electrode SE, and the drain electrode DE may be included in the thin film transistor TFT which may be a switching element.

A planarization film PLA may be disposed on the source electrode SE and the drain electrode DE. In an exemplary embodiment of the present invention, the planarization film PLA may include an organic material, but exemplary embodiments of the present invention are not limited thereto.

A first electrode E1 may be disposed on the planarization film PLA. The first electrode E1 may penetrate the planarization film PLA to be connected to the drain electrode DE. In an exemplary embodiment of the present invention, the first electrode E1 may be an anode electrode.

A pixel defining film PDL partially exposing the first electrode E1 may be disposed on the planarization film PLA. In an exemplary embodiment of the present invention, the pixel defining film PDL may include an organic material.

The organic light emitting layer OL may be disposed on the first electrode E1 exposed by the pixel defining film PDL. In an exemplary embodiment of the present invention, the organic light emitting layer OL may include a low-molecular organic material or a high-molecular organic material such as PEDOT (Poly 3,4-ethylenedioxythiophene). The organic light emitting layer OL may include a multi-layered film including one or more of a hole injection layer HIL, a hole transporting layer HTL, an electron transporting layer ETL, or an electron injection layer EIL.

A second electrode E2 may be disposed on the organic light emitting layer OL and the pixel defining film PDL. In an exemplary embodiment of the present invention, the second electrode E2 may be a cathode electrode to which a common power supply (ELVSS) is supplied.

The first electrode E1, the organic light emitting layer OL, and the second electrode E2 may be included in a light emitting diode OLED.

An encapsulation unit 150 may be disposed on the light emitting diode OLED. The encapsulation unit 150 may be disposed on (e.g., may encapsulate) the light emitting diode OLED and may prevent moisture from being introduced into the light emitting diode OLED from the outside. In an exemplary embodiment of the present invention, the encapsulation unit 150 may completely cover the display unit 130.

The encapsulation unit 150 may include a thin film encapsulation layer, and may include one or more organic films and one or more inorganic films. As an example, the encapsulation unit 150 may include a first inorganic film 151 disposed on the second electrode E2, an organic film 153 disposed on the first inorganic film 151, and a second inorganic film 155 disposed on the organic film 153. Thus, the first inorganic film 151 may be in direct contact with the light emitting diode OLED. For example, the first inorganic film 151 may be in direct contact with an uppermost layer of the light emitting diode OLED (e.g., second electrode E2).

The first inorganic film 151 may prevent moisture, or oxygen from penetrating into the light emitting diode OLED. The first inorganic film 151 may include silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride (SiON).

The organic film 153 may increase flatness of the display device 1. The organic film 153 may include a liquid organic material, for example, acrylic resin, methacrylic resin, polyisoprene, vinyl resin, epoxy resin, urethane resin, cellulose resin, or perylene resin.

The second inorganic film 155 may have a function substantially the same as or similar to that of the first inorganic film 151, and may include a material substantially the same as or similar to that of the first inorganic film 151. The second inorganic film 155 may completely cover the organic film 153. In an exemplary embodiment of the present invention, the second inorganic film 155 and the first inorganic film 151 may be in direct contact with each other in the non-display area NDA to form an inorganic-inorganic junction. Thus, the organic film 153 may be omitted in areas where there second inorganic film 155 is in direct contact with the first inorganic film.

A driving circuit 200 may be disposed on the second portion 110B of the flexible base layer 110. The driving circuit 200 may include a driving chip 210, a first terminal 230 connected to the driving chip 210, and a second terminal 250 spaced apart from the first terminal 230 and connected to the driving chip 210. The first terminal 230 and the second terminal 250 may be positioned between the driving chip 210 and the second portion 110B of the flexible base layer 110. Surfaces of the first terminal 230 and the second terminal 250 facing the driving chip 210 may be substantially aligned with each other along a direction parallel to surface of the second portion 110B of the flexible base layer 110 facing the driving chip 210.

In an exemplary embodiment of the present invention, the driving chip 210 may be a data driver IC providing a data signal driving the display unit 130.

The first terminal 230 may be an output terminal outputting a driving signal for driving the display unit 130, and the second terminal 250 may be an input terminal receiving a control signal and a power supplied from the circuit board unit 300. The plurality of first terminals 230 may be provided along the first direction DR1 corresponding to first pads 193, and may be spaced apart from the second terminals 250 along the second direction DR2. The plurality of second terminals 250 may also be provided corresponding to second pads 195 along the first direction DR1. Thus, the number of first terminals 230 may correspond with the number of first pads 193, and the number of second terminal 250 may correspond with the number of second pads 195.

In an exemplary embodiment of the present invention, each of the first terminal 230 and the second terminal 250 may include a first conductive material. In an exemplary embodiment of the present invention, the first conductive material may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), or copper (Cu). In an exemplary embodiment of the present invention, the first terminal 230 and the second terminal 250 may include a same material as each other.

The first pad 193 and the second pad 195 may each be disposed on the second portion 110B of the flexible base layer 110. In an exemplary embodiment of the present invention, the plurality of first pads 193 may be provided along the first direction DR1, and may be spaced apart from the second pads 195 along the second direction DR2. The plurality of second pads 195 may also be provided along the first direction DR1. The first pad 193 and the second pad 195 may each be electrically connected to the driving circuit 200.

A first wiring 181 electrically connecting the first pad 193 and the display unit 130 may be disposed on the flexible base layer 110. The first wiring 181 may be disposed on the first portion 110A of the flexible base layer 110 as well as on the second portion 110B of the flexible base layer 110.

The circuit board unit 300 may be connected to an external system and a power supply unit. The circuit board unit 300 may supply a control signal, or a power supply to the display unit 130 and the driving circuit 200. The circuit board unit 300 may be disposed on the second portion 110B of the flexible base layer 110. The circuit board unit 300 may be spaced relatively further away from the display are DA than the driving circuit 200 (e.g., when the display device 1 is in a flat state). The circuit board unit 300 may overhang the second portion 110B of the flexible base layer 110 along the second direction DR2.

In an exemplary embodiment of the present invention, the circuit board unit 300 may include a circuit board 310 and a circuit terminal 330 connected to the circuit board 310.

The circuit board 310 may be a printed circuit board, and may be rigid or flexible. In an exemplary embodiment of the present invention, a part of the circuit board 310 may be rigid, and the other part thereof may be flexible.

The circuit terminal 330 may include a conductive material. The circuit terminal 330 may include a same material as the first terminal 230 and the second terminal 250. Alternatively, the circuit terminal 330 may include a material different from the first terminal 230 and the second terminal 250. In an exemplary embodiment of the present invention, the plurality of circuit terminals 330 may be provided, and may be arranged along the first direction DR1.

A circuit pad 197 may be disposed on the second portion 110B of the flexible base layer 110. The circuit pad 197 may be electrically connected to the circuit board unit 300. In an exemplary embodiment of the present invention, the first pad 193 and the second pad 195 may be positioned closer the display area DA as compared with the circuit pad 197 (e.g., when the display device 1 is in a flat state). A second wiring 183 electrically connecting the second pad 195 and the circuit pad 197 may be disposed on the second portion 110B of the flexible base layer 110. In an exemplary embodiment of the present invention, the plurality of circuit pads 197 may be provided along the first direction DR1 according to the circuit terminal 330.

The first pad 193 may receive a driving signal output from the driving circuit 200. The driving signal output from the driving circuit 200 may be provided to the display unit 130 through the first pad 193 and the first wiring 181.

The second pad 195 may transmit a control signal and a power supply provided from the circuit board unit 300 to the driving circuit 200, and the circuit pad 197 may receive a control signal and a power supply provided from the circuit board unit 300.

The control signal and power supply provided from the circuit board unit 300 may be provided to the driving circuit 200 through the circuit pad 197, the second wiring 183, and the second pad 195.

The first pad 193 may be electrically connected to the first terminal 230, and the second pad 195 may be electrically connected to the second terminal 250.

The first pad 193 and the first terminal 230 may be in direct contact with each other. For example, a separate anisotropic conductive film need not be disposed between the first pad 193 and the first terminal 230. The second pad 195 and the second terminal 250 may be in direct contact with each other, and a separate anisotropic conductive film need not be disposed between the second pad 195 and the second terminal 250.

Accordingly, since a separate anisotropic conductive film may be omitted, a material cost may be reduced and connection resistance may be reduced.

Each of the first pad 193 and the second pad 195 may include a second conductive material. The second conductive material may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), or copper (Cu). Each of the first pad 193 and the second pad 195 may include a single-layered film or a multi-layered film. For example, each of the first pad 193 and the second pad 195 may have a laminate structure of Ti/Al/Ti, Mo/Al/Mo, Mo/AlGe/Mo, or Ti/Cu. In an exemplary embodiment of the present invention, the first pad 193 and the second pad 195 may include a same material as each other.

The circuit terminal 330 may include a same material as the first pad 193 and the second pad 195. Alternatively, the circuit terminal 330 may include a material different from the first pad 193 and the second pad 195.

In an exemplary embodiment of the present invention, the first conductive material included in the first terminal 230 and the second terminal 250 may be different form the second conductive material included in the first pad 193 and the second pad 195. For example, when the first terminal 230 and the second terminal 250 include gold (Au) as the first conductive material, the first pad 193 and the second pad 195 may include titanium (Ti) or aluminum (Al) as the second conductive material.

In an exemplary embodiment of the present invention, the first pad 193 and the first terminal 230 may be connected with each other by an ultrasonic bonding method. Ultrasonic bonding is a method of bonding two metals by applying pressure and ultrasonic vibration.

When the first pad 193 and the first terminal 230 are coupled with each other by the ultrasonic bonding method, intermetallic diffusion may occur around a contact interface S1 between the first pad 193 and the first terminal 230 in the bonding process. For example, the first conductive material included in the first terminal 230 may be partially diffused into the first pad 193, and the second conductive material included in the first pad 193 may be partially diffused into the first terminal 230.

Thus, the first pad 193 may include a first pad region 1931 and a second pad region 1933. The first pad region 1931 may be a portion of the first pad 193 disposed on the second portion 110B (e.g., in direct contact with the second portion 11B), including the second conductive material (for example, Ti or Al) and not including the first conductive material (for example, Au). The second pad region 1933 may be a portion of the first pad 193 disposed between the first pad region 1931 and the contact interface S1 (e.g., in direct contact with the contact interface S1), including the second conductive material (for example, Ti or Al) and not including the first conductive material (for example, Au).

Similarly, the first terminal 230 may include a first terminal region 231 and a second terminal region 233. The first terminal region 231 may be a portion of the first terminal including the first conductive material (for example, Au) and not including the second conductive material (for example, Ti or Al). The second terminal region 233 may be a portion of the first terminal 230 disposed between the first terminal region 231 and the contact interface S1 and including the second conductive material (for example, Ti or Al) and the first conductive material (for example, Au). The first terminal region 231 may be in direct contact with the driving chip 210 and the second terminal region may be in direct contact with the contact interface S1.

The second pad 195 and the second terminal 250 may also be coupled with each other by an ultrasonic bonding method. Therefore, the second pad 195 may include a third pad region 1951 including the second conductive material (for example, Ti or Al) and not including the first conductive material (for example, Au), and a fourth pad region 1953 disposed between the third pad region 1951 and a contact interface S2 between the second pad 195 and the second terminal 250 and including the second conductive material and the first conductive material.

Similarly, the second terminal 250 may include a third terminal region 251 including the first conductive material and not including the second conductive material, and a fourth terminal region 253 disposed between the third terminal region 251 and the contact interface S2 and including the second conductive material and the first conductive material.

In an exemplary embodiment of the present invention, the circuit pad 197 may be electrically connected to the circuit terminal 330 of the circuit board unit 300. The circuit pad 197 and the circuit terminal 330 may be in direct contact with each other. The circuit pad 197 and the circuit terminal 330 may also be coupled with each other by an ultrasonic bonding method.

Therefore, when the circuit pad 197 includes a same material as the second pad 195 and the circuit terminal 330 includes a same material as the second terminal 250, the circuit pad 197 may include a first circuit pad region 1971 including the second conductive material and not including the first conductive material, and a second circuit pad region 1973 disposed between the first circuit pad region 1971 and a contact interface S3 between the circuit pad 197 and the circuit terminal 330 and including the second conductive material and the first conductive material. Similarly, the circuit terminal 330 may include a first circuit terminal region 331 including the firsts conductive material and not including the second conductive material, and a second circuit terminal region 333 disposed between the first circuit terminal region 331 and the contact interface S3 and including the first conductive material and the second conductive material. However, exemplary embodiments of the present invention are not limited thereto, and the circuit pad 197 and the circuit terminal 330 may be coupled with each other through an anisotropic conductive film. As an example, the circuit pad 197 and the circuit terminal 330 may be coupled with each other by a connector. For example, the connection may be an electrically conductive layer disposed between the circuit pad 197 and the circuit terminal 330.

A support member 500 may be disposed on the flexible base layer 110. For example, the support member 500 may be disposed on a side of the flexible base layer 110 opposite the display unit 130. The support member 500 may increase the strength and/or rigidity of the flexible base layer 110, may be attached to the lower surface of the flexible base layer 110.

In an exemplary embodiment of the present invention, the support member 500 may include a plastic film including polyethylene naphthalate (PEN), polyethylene terephthalate (PET), a polymer, or a combination of polymers. The support member 500 may include a multilayer polymeric stack and a synthetic polymer film including a polymeric material combined with nanoparticles or microparticles dispersed therein.

The support member 500 may include a first support member 500A attached to the lower surface of the first portion 110A of the flexible base layer 110 and a second support member 500B attached to the lower surface of the second portion 110B of the flexible base layer 110. In an exemplary embodiment of the present invention, the first support member 500A and the second support member 500B may be connected to each other. Alternatively, the first support member 500A and the second support member 500B may be disconnected from each other and spaced apart from each other (e.g., in the second direction DR2 when the display device 1 is in a flat state).

The second support member 500B may include an opening 510 overlapping the driving circuit 200. In an exemplary embodiment of the present invention, the opening 510 may overlap the first pad 193 in direct contact with the first terminal 230, and may overlap the second pad 195 in direct contact with the second terminal 250.

In an exemplary embodiment of the present invention, the driving circuit 200 may completely overlap the opening 510. Alternatively, the opening 510 may have a wider width than a width of the driving circuit 200. As an example, the second support member 500B might not include a portion overlapping the drive chip 210, the first terminal 230, and the second terminal 250 of the drive circuit 200. In an exemplary embodiment of the present invention, the area of the opening 510 may be substantially equal to or greater than the area of the driving circuit 200 on a plane (e.g., when viewed from a plan view when the display device 1 is in a flat state).

A reinforcing member 610 may be disposed in the opening 510. The reinforcing member 610 may increase the strength and/or rigidity of a portion of the second portion 110B of the flexible base layer 110, the portion being exposed by the opening 510, and may attached to the lower surface of the second portion 110B exposed through the opening 510. The reinforcing member 610 may be in direct contact with a surface of the second portion 110B of the flexible base layer 110 opposite the display unit 130 when the display device 1 is in a flat state.

The reinforcing member 610 may include a material different from that of the second support member 500B. As an example, when the second support member 500B includes a film material such as polyethylene terephthalate, the reinforcing member 610 may include a photocurable resin. When the reinforcing member 610 includes a photocurable resin, the reinforcing member 610 may be in direct contact with the second portion 11b and the side surface of the second support member 500 defining the opening 510.

The reinforcing member 610 may include a material having higher hardness than the second support member 500B. For example, the hardness of the reinforcing member 610 may be greater than the hardness of the second support member 500B. For example, when the second support member 500B includes a film material such as polyethylene terephthalate, the reinforcing member 610 may include a plastic material having higher hardness than polyethylene terephthalate, a metal, or a combination thereof.

The reinforcing member 610 may substantially fill the opening 510 and may be attached to the lower surface of the second portion 110B exposed through the opening 510. As an example, the reinforcing member 610 may include an adhesive tape attached to the lower surface of the second portion 110B exposed through the opening 510.

Figure 7:
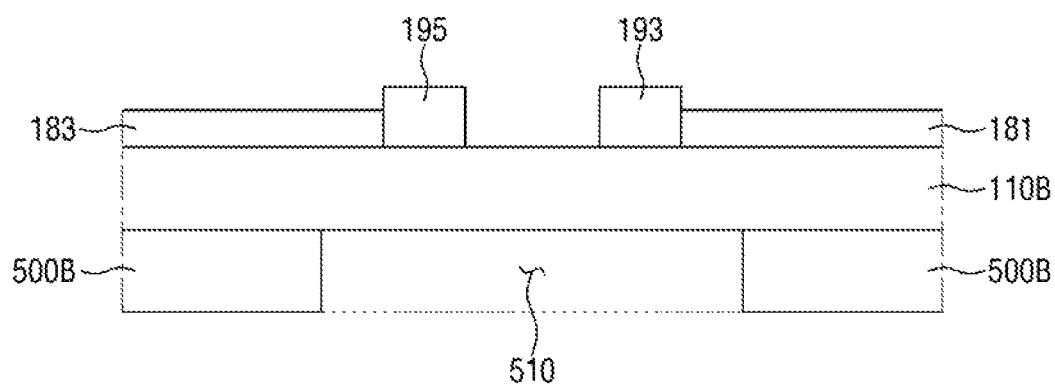
FIGS. 7 to 9 illustrate a coupling process between the driving circuit and the first pad and between the driving circuit the second pad in FIG. 3.
Figure 8:
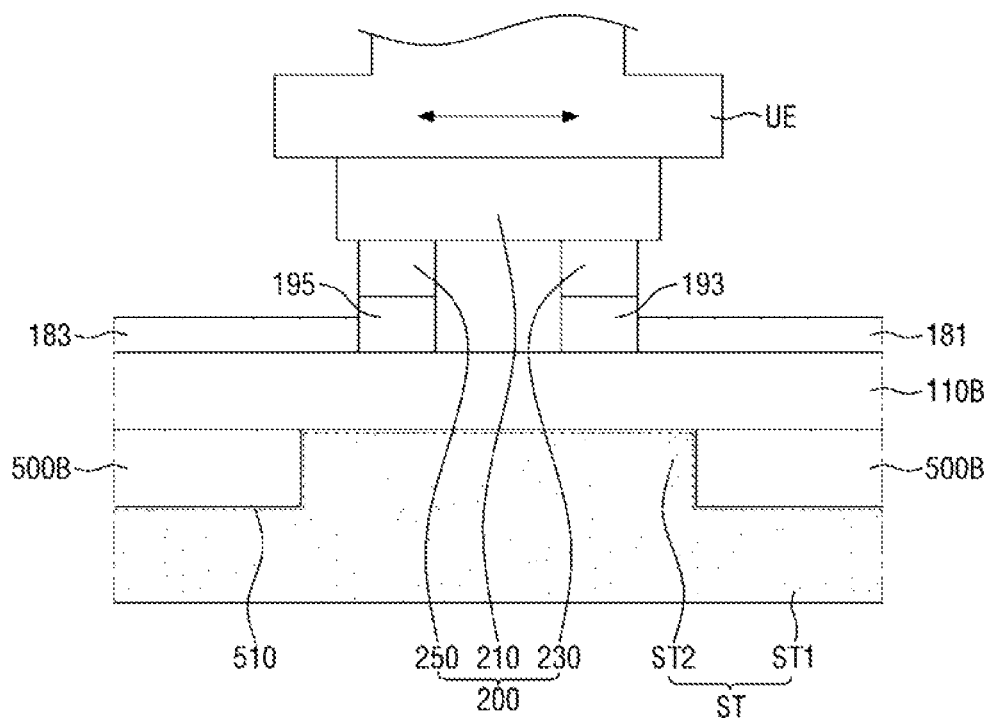
Figure 9:
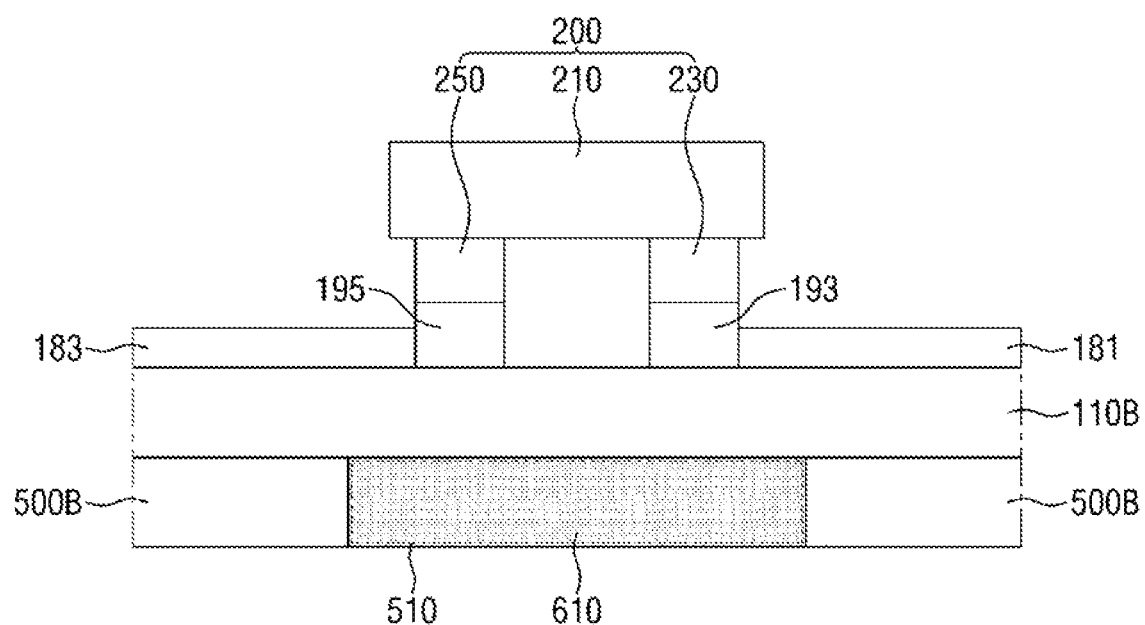

FIGS. 7 to 9 illustrate a coupling process between the driving circuit and the first pad and between the driving circuit and the second pad in FIG. 3.

Referring to FIGS. 7 to 9, the opening 510 may be formed in the second support member 500B. The opening 510 may overlap the first pad 193 and the second pad 195.

The second portion 110B coupled with the second support member 500B may be positioned on a stage ST. The stage ST may include a material having rigidity such as stainless steel, and may include a flat portion ST1 disposed under the second support member 500B and a protruding portion ST2 protruding from the flat portion ST1. The protruding portion ST2 may be disposed in the opening 510 and may support the second portion 110B.

The driving circuit 200 may be disposed on the second portion 110B. The first terminal 230 of the driving circuit 200 may come into direct contact with the first pad 193, and the second terminal 250 may come into direct contact with the second pad 195. Pressure may be applied to the upper surface of the driving circuit 200 by a head UE, and ultrasonic vibration may be applied to the head UE. For example, the driving circuit 200 may be mounted on the second portion 110B by an ultrasonic bonding method. Thus, the first terminal 230 and the first pad 193 may be attached to each other, and the second terminal 250 and the second pad 195 may be attached to each other.

When the opening 510 is not formed in the second support member 500B (e.g., when the second support member 500B overlapping the driving circuit 200 exists), there may be a possibility that the second support member 500B absorbs the ultrasonic vibration in the ultrasonic bonding process, and thus there exists a possibility that the first pad 193 and the driving circuit 200 and the second pad 195 and the driving circuit 200 might not be attached to each other. In an exemplary embodiment of the present invention, the opening 510 may be formed in the second support member 500B before the ultrasonic bonding, the protruding portion ST2 of the stage ST may be disposed in the opening 510, and then ultrasonic bonding may be performed. Thus, bonding reliability between the first pad 193 and the driving circuit 200 and between the second pad 195 and the driving circuit 200 may be increased.

After the drive circuit 200 is mounted on the second portion 110B, the reinforcing member 610 may be disposed in the opening 510 (see, e.g., FIG. 9). Thus, the strength and/or firmness of a portion of the second portion 110B, such as the portion being exposed by the opening 510, may be increased by disposing the reinforcing member 610 in the opening 510.

Figure 10:
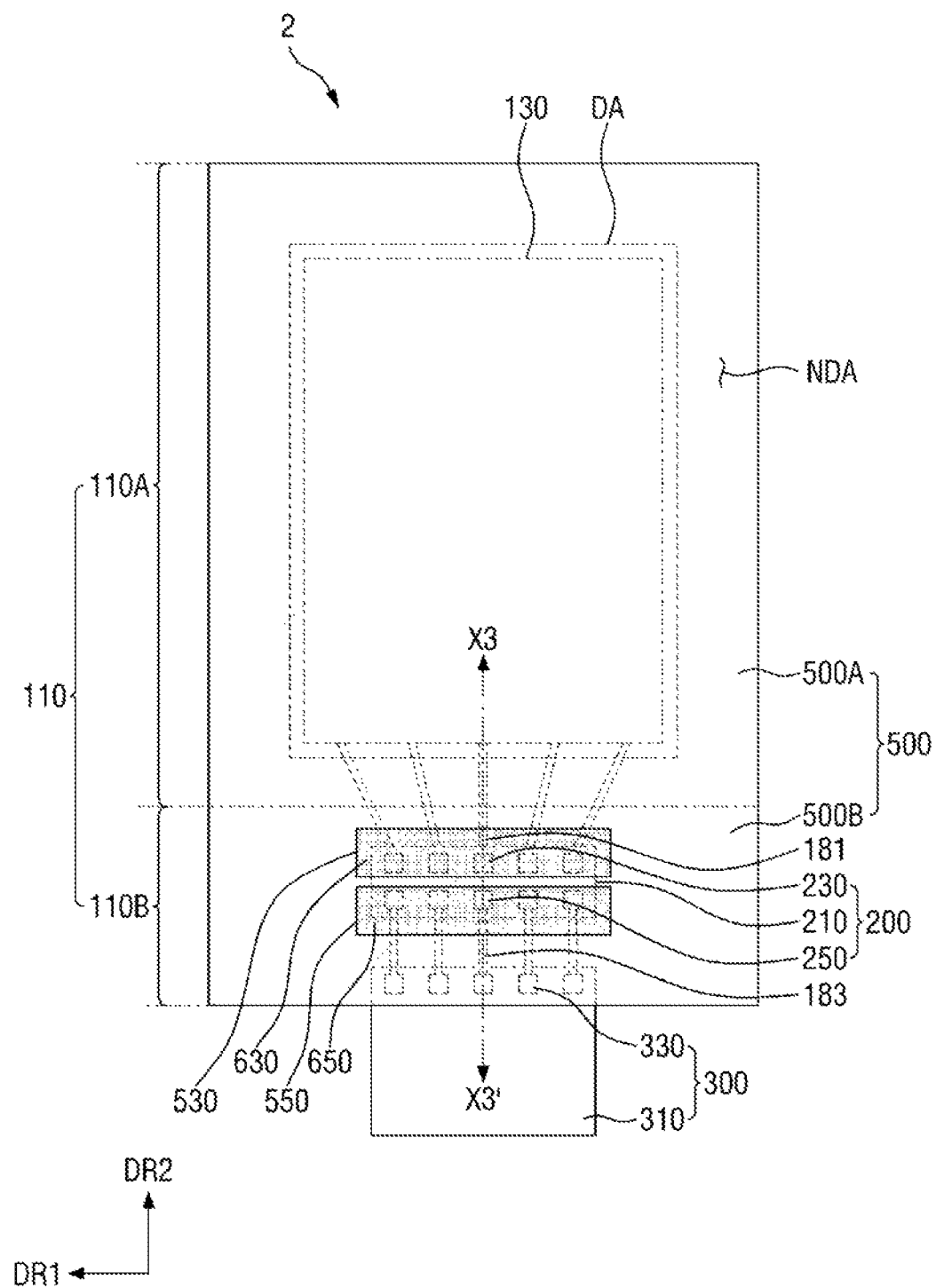
FIG. 10 is a rear view of a display device according to an exemplary embodiment of the present invention.
Figure 11:
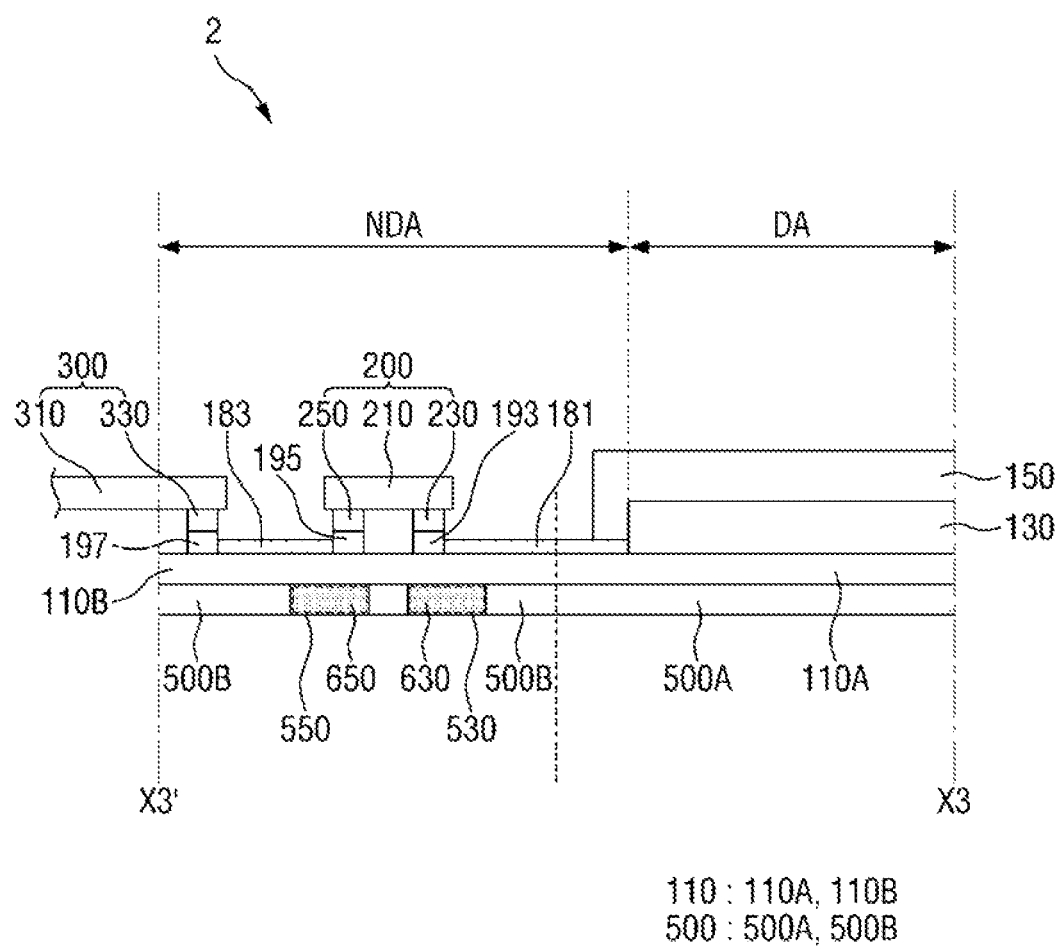
FIG. 11 is a cross-sectional view taken along the line X3-X3' in FIG. 10.

FIG. 10 is a rear view of a display device according to an exemplary embodiment of the present invention. FIG. 11 is a cross-sectional view taken along the line X3-X3' in FIG. 10.

Referring to FIGS. 10 and 11, a display device 2 according to an exemplary embodiment of the present invention may be substantially the same as the display device 1 described in more detail above with reference to FIGS. 1 to 9, except for a first opening 530, a second opening 550, a first reinforcing member 630 and a second reinforcing member 650. Therefore, duplicative descriptions may be omitted below.

The second support member 500B may include a first opening 530 and a second opening 550 which each overlap the driving circuit 200. In an exemplary embodiment of the present invention, the first opening 530 may overlap the first terminal 230 and the first pad 193, and the second opening 550 may overlap the second terminal 250 and the second pad 195.

In an exemplary embodiment of the present invention, the first opening 530 and the second opening 550 may be spaced from each other (e.g., in the second direction DR2). As an example, the edge of the first opening 530 might not be connected with the edge of the second opening 550 on a plane (e.g., when viewed in a plan view).

As an example, the first opening 530 may have a rectangular shape in a plan view and may overlap the plurality of first pads 193 and the second opening 550 may have a rectangular shape in a plan view and may overlap the plurality of second pads 195; however, exemplary embodiments of the present invention are not limited thereto. The number/shape of the first openings 530 and the number/shape of the second openings 550 may be variously changed, as desired.

A first reinforcing member 630 may be disposed in the first opening 530, and a second reinforcing member 650 may be disposed in the second opening 550.

In an exemplary embodiment of the present invention, the first reinforcing member 630 and the second reinforcing member 650 may be spaced apart from each other (e.g., in the second direction DR2). However, exemplary embodiments of the present invention are not limited thereto. In an exemplary embodiment of the present invention, the first reinforcing member 630 and the second reinforcing member 650 may be connected to each other. For example, the first reinforcing member 630 and the second reinforcing member 650 may each be positioned in a same opening.

The material and shape of the first reinforcing member 630 and the second reinforcing member 650 may be substantially the same as or similar to those of the above-described reinforcing member 610.

Figure 12:
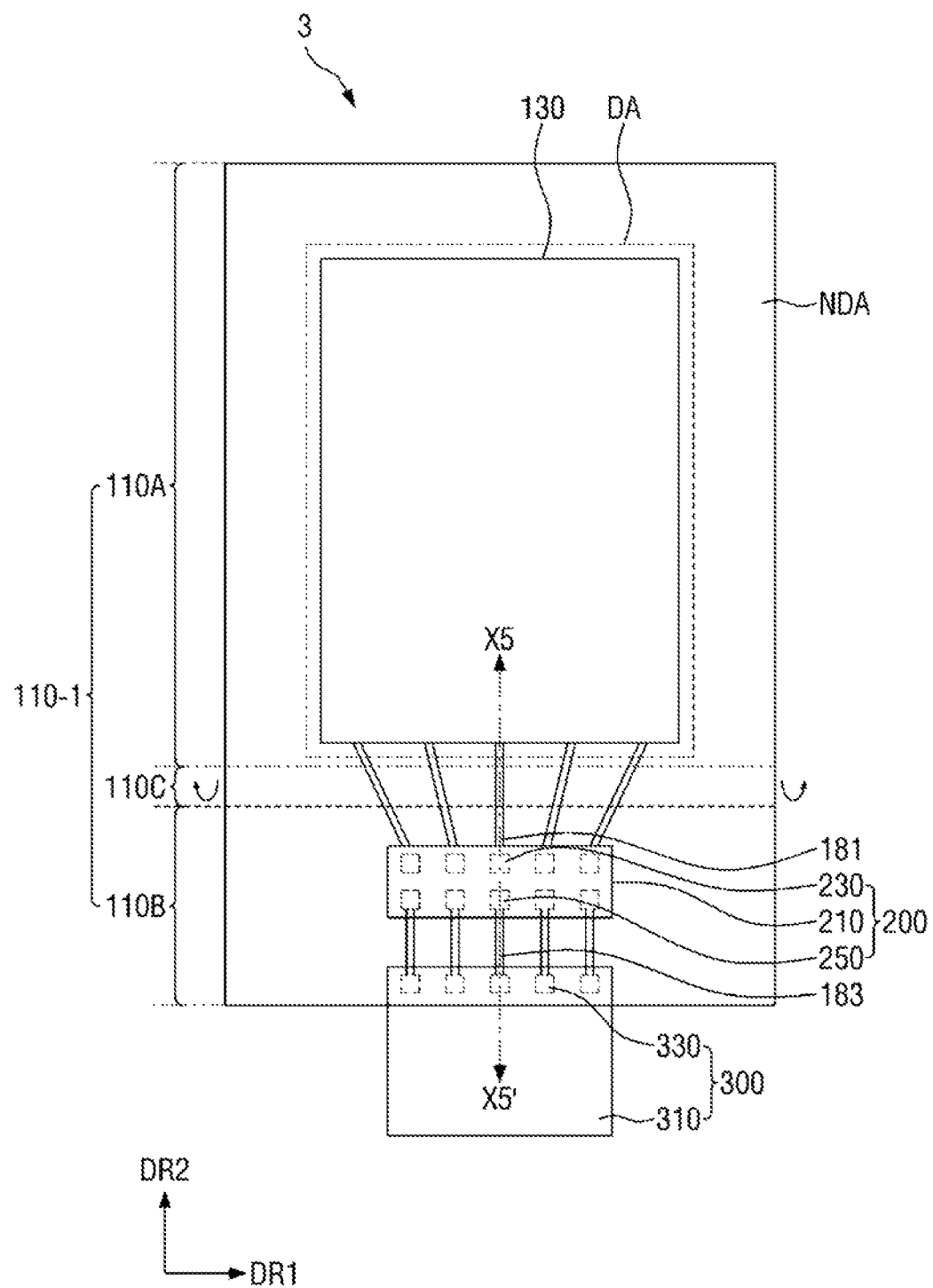
FIG. 12 is a plan view of a display device in an unbent state according to an exemplary embodiment of the present invention.
Figure 13:
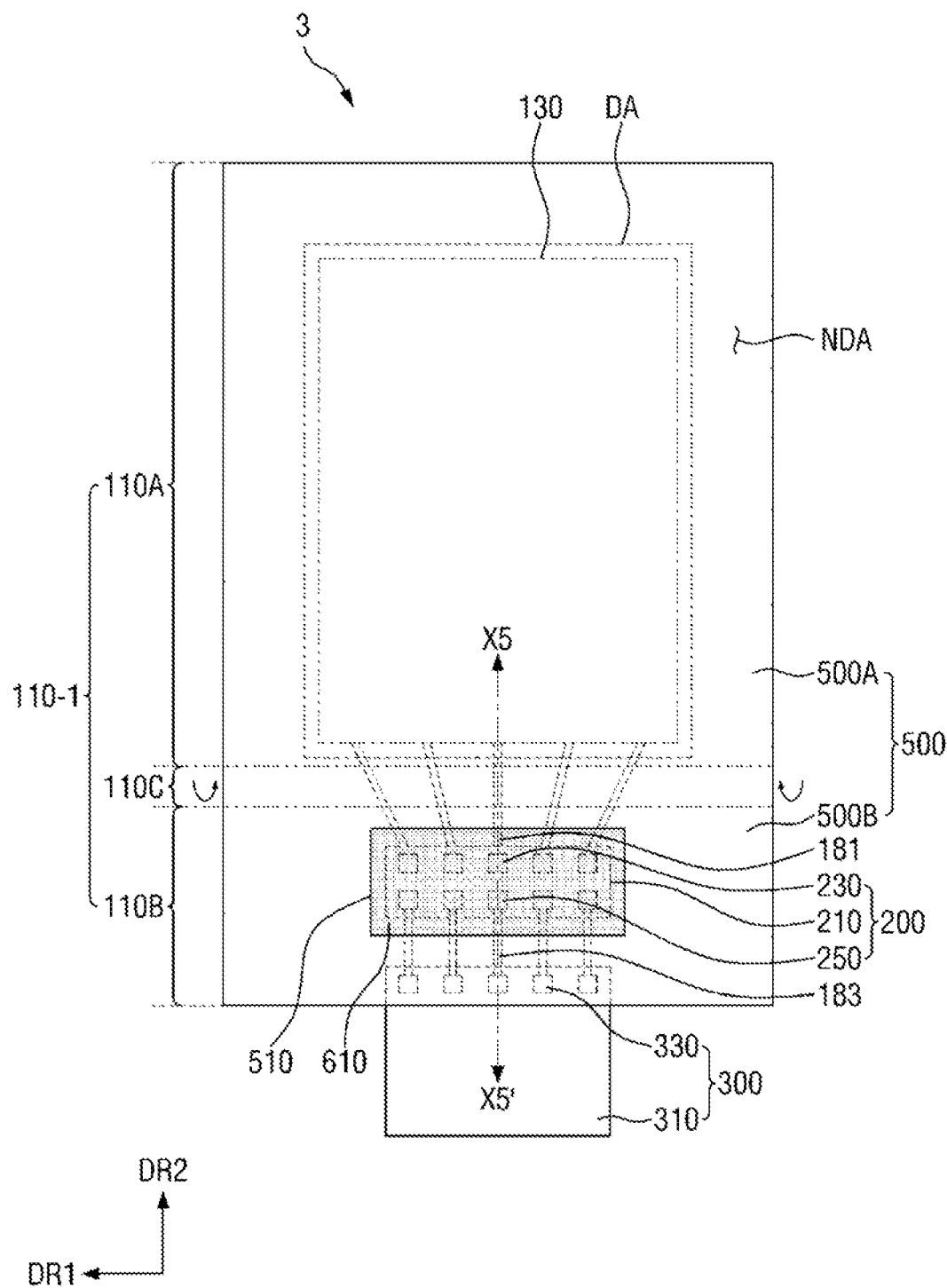
FIG. 13 is a rear view of the display device of FIG. 12.
Figure 14:
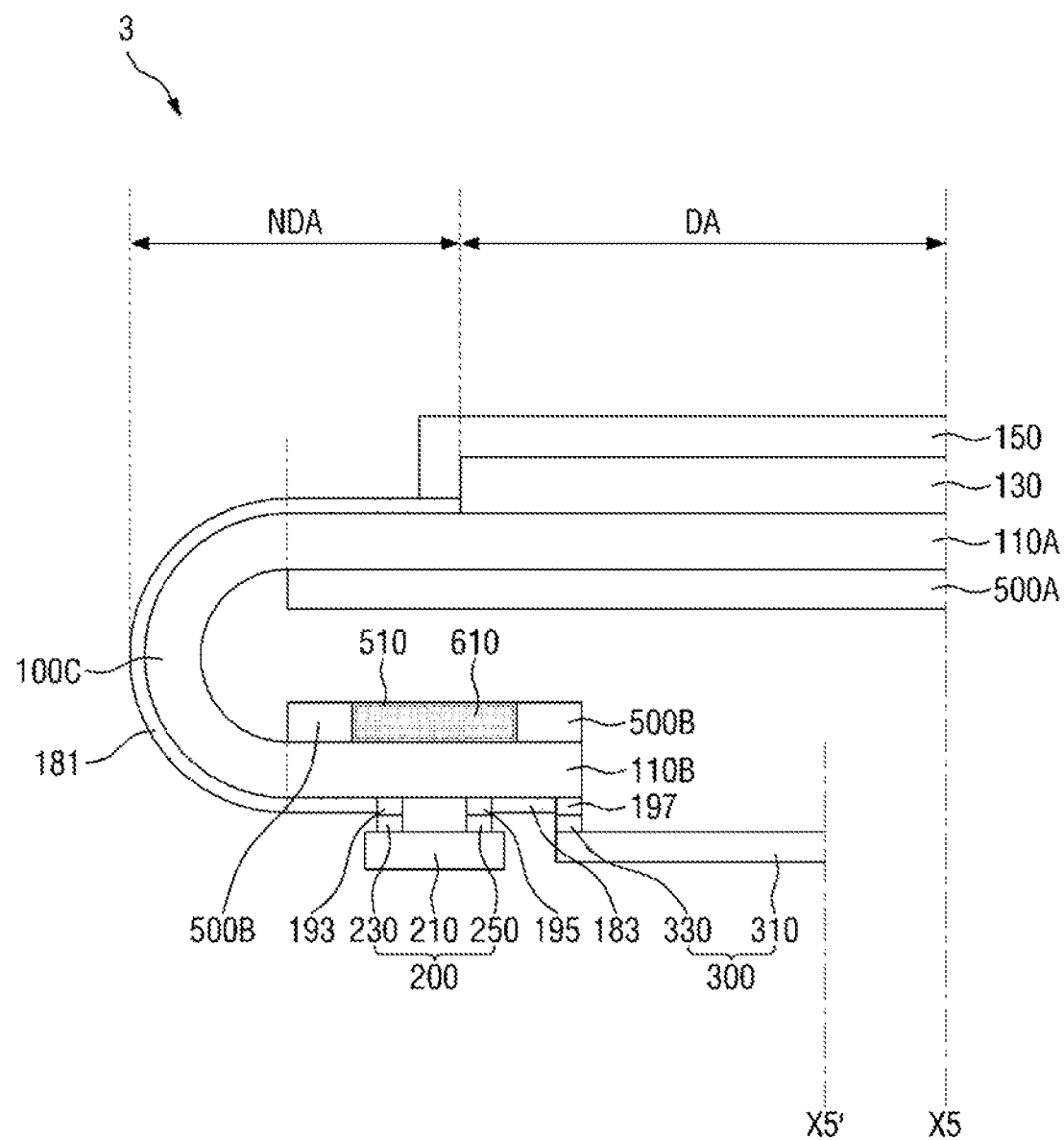
FIG. 14 is a cross-sectional view taken along the line X5-X5' in FIGS. 12 and 13 of the display device of FIGS. 12 and 13 in a bent state.

FIG. 12 is a plan view of a display device in an unbent state according to an exemplary embodiment of the present invention. FIG. 13 is a rear view of the display device of FIG. 12. FIG. 14 is a cross-sectional view taken along the line X5-X5' in FIGS. 12 and 13 of the display device of FIGS. 12 and 13 in a bent state.

Referring to FIGS. 12 to 14, a display device 3 according to an exemplary embodiment of the present invention may be substantially the same as the display device 1 described in more detail above with reference to FIGS. 1 to 9, except for a flexible base layer 110-1. The flexible base layer 110-1 may include a bending portion 110C. Therefore, duplicative descriptions may be omitted below.

A flexible base layer 110-1 may include a bending portion 110C between the first portion 110A and the second portion 110B. In the first portion 110A, a display area DA in which the display unit 130 is disposed may be defined, and a part of the non-display area NDA may be defined. In the second portion 110B, another part of the non-display area NDA may be defined, and the driving circuit 200 may be disposed. In the bending portion 110C, another part of the non-display area NDA may be defined, and the first wiring 181 electrically connecting the display unit 130 and the first pad 193 may be disposed.

The bending portion 110C is a bendable portion. In an exemplary embodiment of the present invention, the bending portion 110C may be bent downward along a virtual bending axis extending in the first direction DR1, and the entire bending portion 110C may have a predetermined curvature in a bent state. The first portion 110A and the second portion 110B may overlap each other in a state where the bending portion 110C is bent. Thus, the display device 3 may be in a bent state when the bending portion 110C is bent or curved.

The support member 500 may be disposed beneath the flexible base layer 110-1.

In an exemplary embodiment of the present invention, the support member 500 might not be disposed on the lower surface of the bending portion 110C. For example, the first support member 500A may be attached to the lower surface of the first portion 110A of the flexible base layer 110, the second support member 500B may be attached to the lower surface of the second portion 110B of the flexible base layer 110 (or the surface facing the lower surface of the first portion 110A in the bending state), and the first support member 500A and the second support member 500B might not be disposed on the lower surface of the bending portion 110C. For example, the first support member 500A and the second support member 500B may be spaced apart from each other (e.g., in the second direction DR2 when the display device 3 is in a flat state), and the lower surface of the bending portion 110C may be exposed. When the support member 500 is not disposed on the lower surface of the bending portion 110C, the entire thickness of the portion where the bending is performed in the display device 3 may be relatively thin. Therefore, the display device 3 can be bent by a relatively smaller force, and stress applied to the bent portion in the display device 3 can be reduced. Thus, an occurrence of defects of damage to the display device 3 may be reduced or eliminated.

When the first portion 110A and the second portion 110B overlap each other in a state where the bending portion 110C is bent, the first support member 500A and the second support member 500B may overlap each other.

The reinforcing member 610 may be disposed in the opening 510 of the second support member 500B. The reinforcing member 610 may overlap the first portion 110A and the first support member 500A in a state where the bending portion 110C is bent. In an exemplary embodiment of the present invention, the reinforcing member 610 may be in direct contact with the lower surface of the second portion 110B exposed through the opening 510, for example, the surface of the second portion 110B facing the lower surface of the first portion 110A in the bent state, and may be spaced apart from the first support member 500A.

When the driving circuit 200 and the circuit board unit 300 are disposed on the second portion 110B, in a state where the bending portion 110C is bent, the driving circuit 200 and the circuit board unit 300 may overlap the first portion 110A, and the circuit board unit 300 may further overlap the display unit 130. Further, at least a part of the driving circuit 200 may overlap the display unit 130.

According to an exemplary embodiment of the present invention, a display device may include the flexible base layer 110 including the first portion 110A, the bending portion 110C adjacent to the first portion 110A and the second portion 110B adjacent to the bending portion 110C. The display unit may be disposed on the first portion 110A of the base layer 110. The first pad 193 may be disposed on the second portion 110B. The first pad 193 may be connected to the first wiring 181. The first terminal 230 may be disposed on the first pad 193. The second pad 195 may be disposed on the second portion 110B and may be spaced apart from the first pad 193. The second pad 195 may be connected to the second wiring 183. The second terminal 250 may be disposed on the second pad 195. The driving chip 210 may be disposed on the first terminal 230 and the second terminal 250. The reinforcing member (e.g., reinforcing member 610) may be disposed on the second portion 110B on an opposite side of the second portion 110B from the driving chip 210. The reinforcing member may overlap the driving chip 210.

According to an exemplary embodiment of the present invention, the reinforcing member (e.g., reinforcing member 610-1 described in more detail below with reference to FIG. 15) may face a surface of the first portion 110A facing the second portion 110B when the bending portion 110C is in a bent state.

According to an exemplary embodiment of the present invention, the reinforcing member (e.g., reinforcing member 610-1 described in more detail below with reference to FIG. 15) may be in direct contact with a surface of the first portion 110A facing the second portion 110B when the bending portion 110C is in a bent state.

Figure 15:
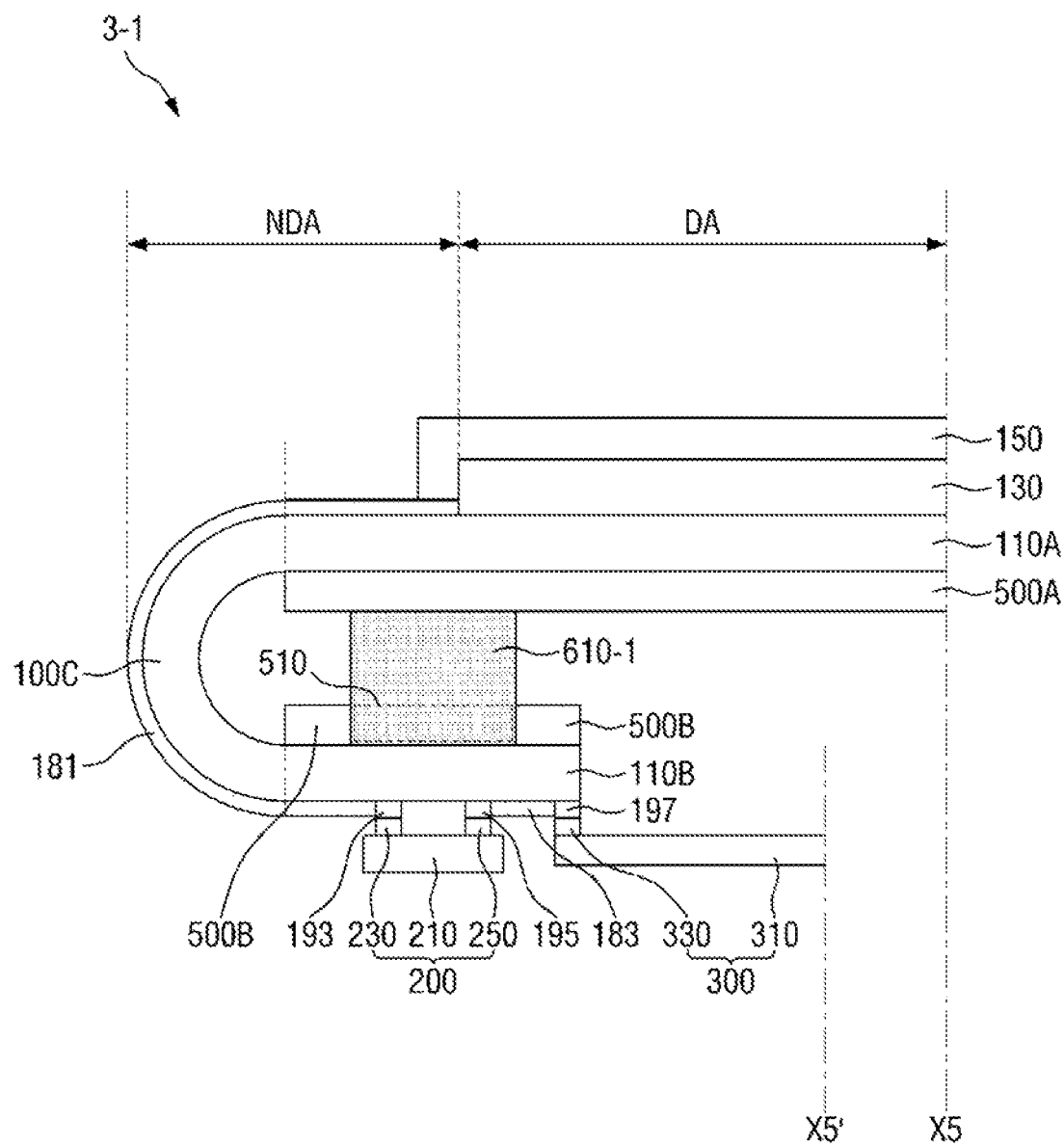
FIG. 15 is a cross-sectional view of a display device according to an exemplary embodiment of the present invention.

FIG. 15 is a cross-sectional view of a display device according to an exemplary embodiment of the present invention.

Referring to FIG. 15, a display device 3-1 according to an exemplary embodiment of the present invention may be substantially the same as the display device 3 described in more detail above with reference to FIGS. 12 to 14, except for a reinforcing member 610-1 attached to the first support member 500A as well as one surface of the second portion 110B exposed through the opening 510 in a state where the bending portion 110C is bent. Therefore, duplicative descriptions may be omitted below.

In an exemplary embodiment of the present invention, the reinforcing member 610-1 may be coupled with the second portion 110B and the first support member 500A in a state where the bending portion 110C is bent. In an exemplary embodiment of the present invention, the reinforcing member 610-1 may include an adhesive tape, such as a foam tape.

When the reinforcing member 610-1 is coupled with the second portion 110B and the first support member 500A, the second portion 110B may be prevented from being sagged or warped in a state where the bending portion 110C is bent.

Figure 16:
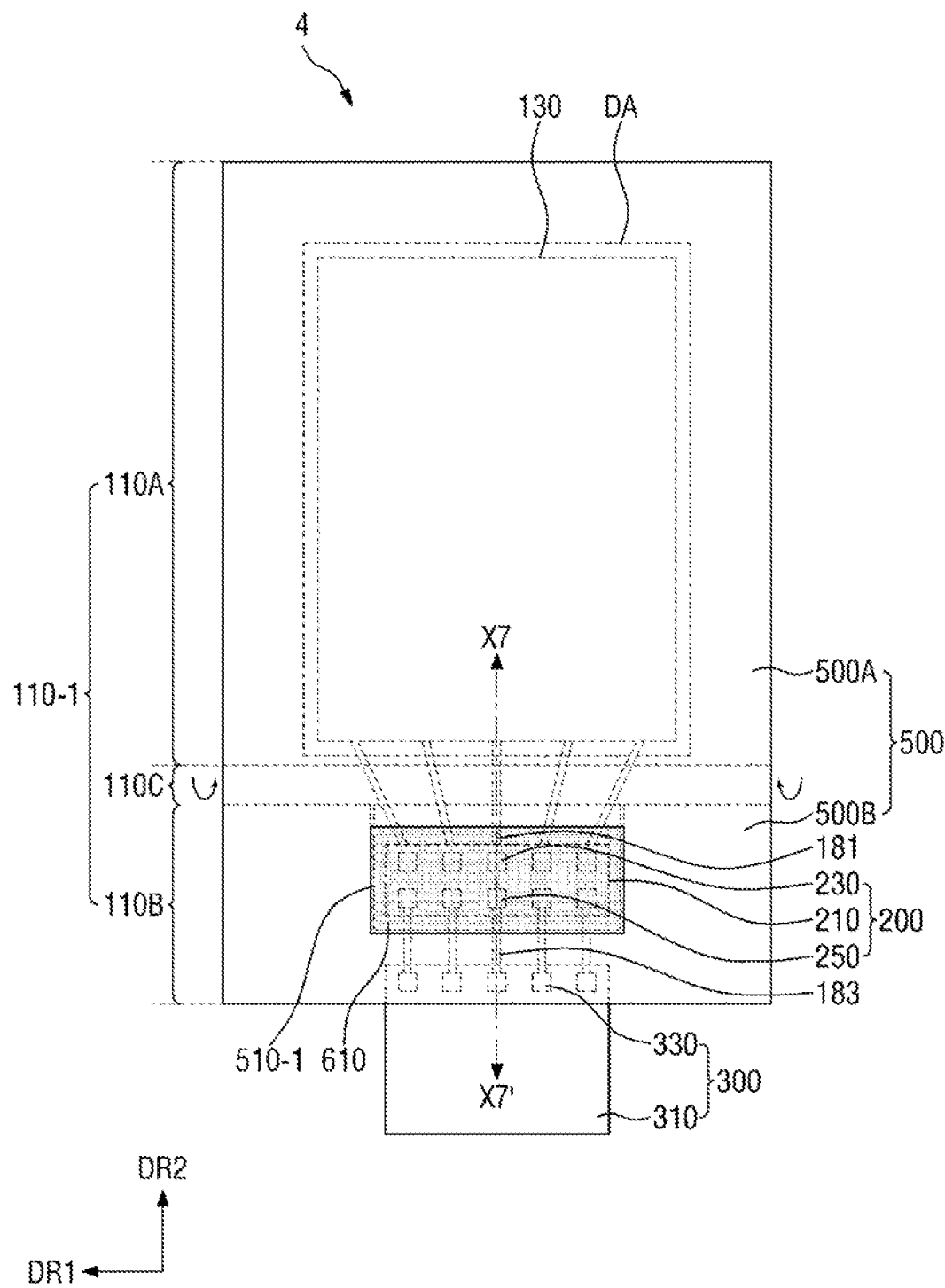
FIG. 16 is a rear view of a display device in an unbent state according to an exemplary embodiment of the present invention.
Figure 17:
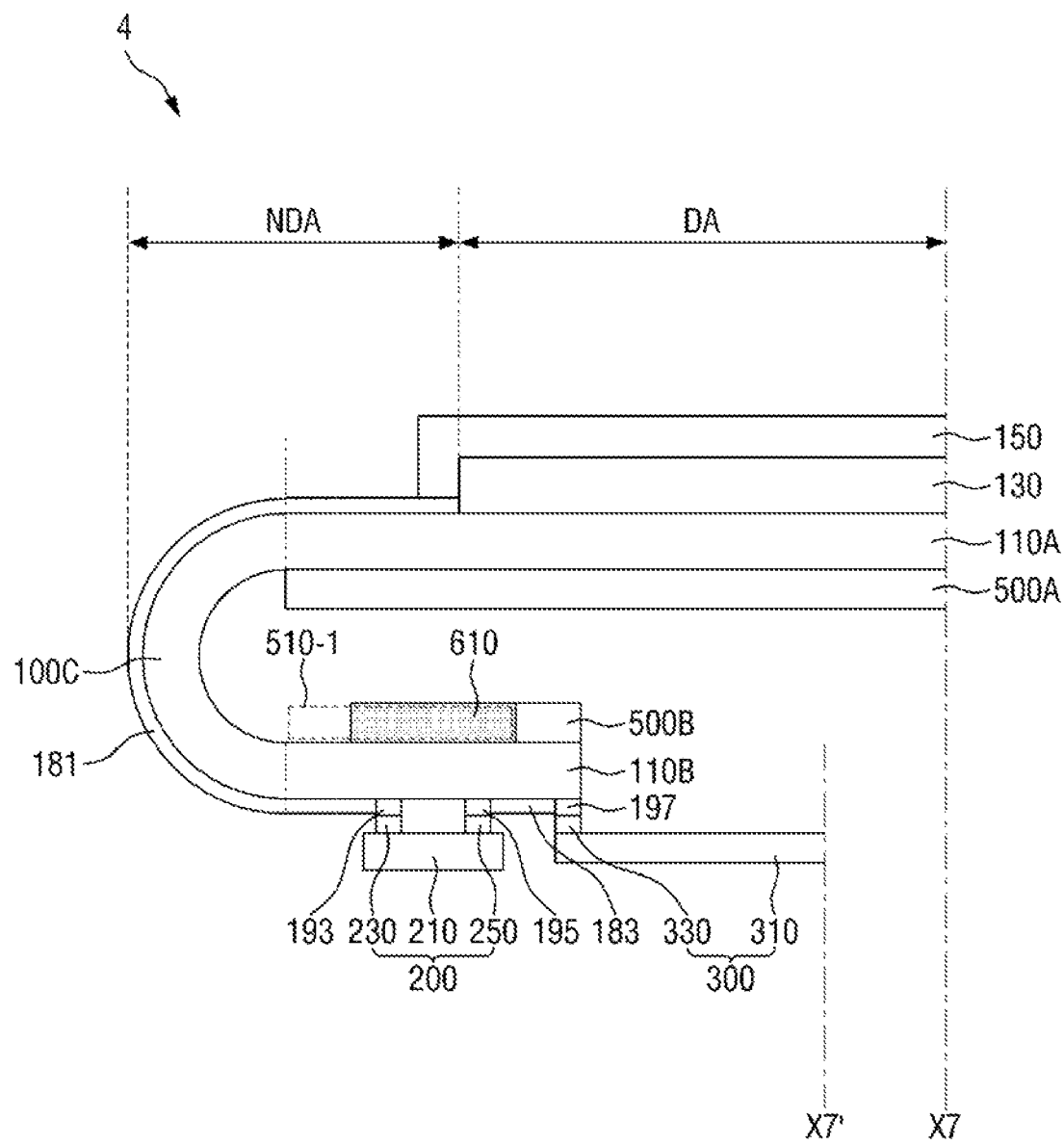
FIG. 17 is a cross-sectional view taken along the line X7-X7' in FIG. 16 of the display device of FIG. 16 in a bent state.

FIG. 16 is a rear view of a display device in an unbent state according to an exemplary embodiment of the present invention. FIG. 17 is a cross-sectional view taken along the line X7-X7' in FIG. 16 of the display device of FIG. 16 in a bent state.

Referring to FIGS. 16 and 17, a display device 4 according to an exemplary embodiment of the present invention may be substantially the same as the display device 1 described in more detail above with reference to FIGS. 12 to 14, except for the shape of an opening 510-1. Therefore, duplicative descriptions may be omitted below.

The opening 510-1 formed in the second support member 500B may have a shape in which one side is open.

For example, one side of the opening 510-1 may be open toward a space between the first support member 500A and the second support member 500B. As an example, the opening 510-1 may be connected to the space between time first support member 500A and the second support member 500B.

The reinforcing member 610 may be disposed in the opening 510-1. In an exemplary embodiment of the present invention, the reinforcing member 610 may fill only a portion of the opening 510-1, the portion overlapping the driving circuit 200, without filling the entire opening 510-1. However, exemplary embodiments of the present invention are not limited thereto. In an exemplary embodiment of the present invention, the reinforcing member 610 may fill the entire opening 510-1.

In an exemplary embodiment of the present invention, as described above with reference to FIGS. 12 to 14, the reinforcing member 610 may be in direct contact with one surface of the second portion 110B exposed through the opening 510-1, but need not be in direct contact with the first support member 500A.

Figure 18:
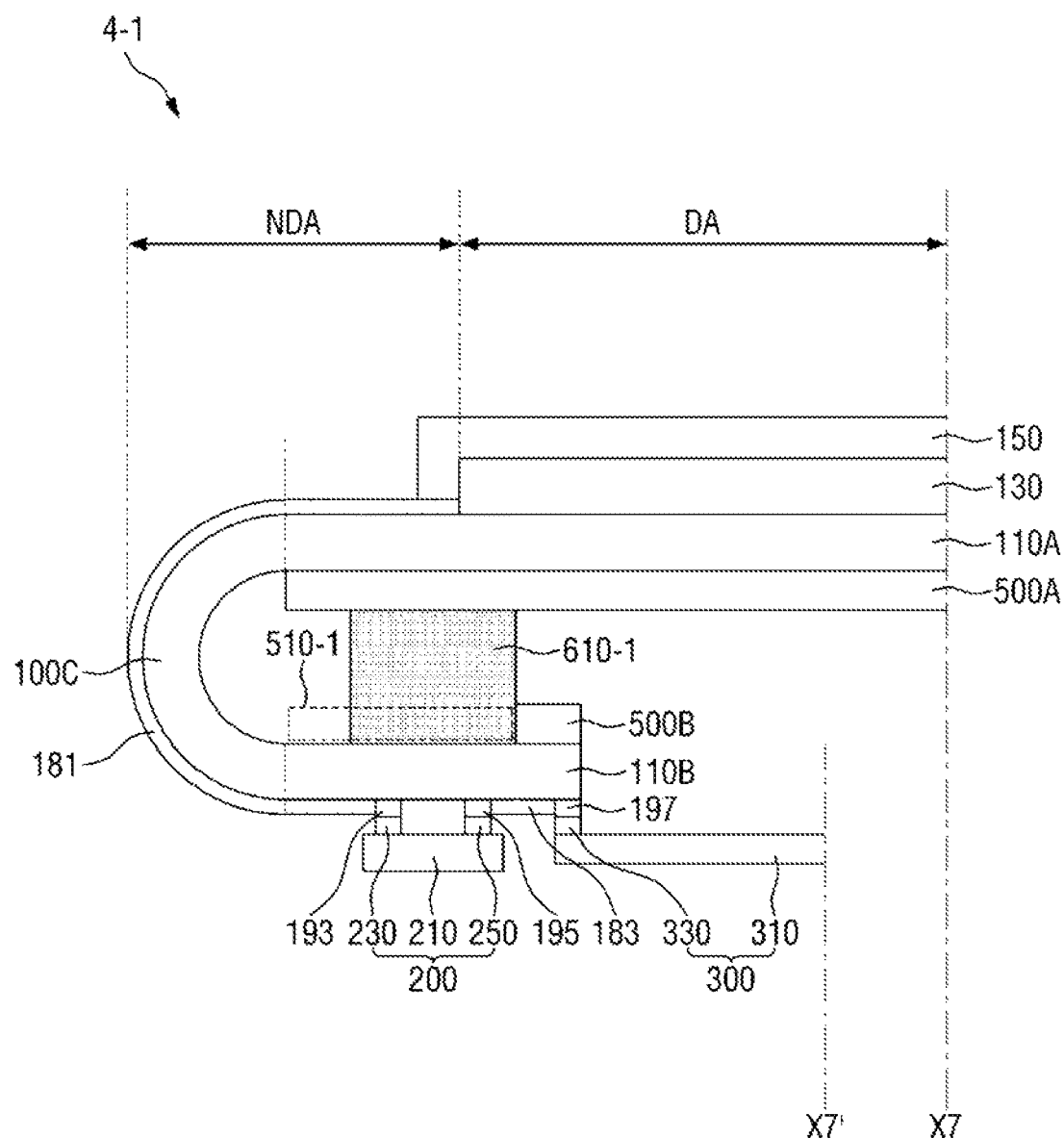
FIG. 18 is a cross-sectional view of a display device according to an exemplary embodiment of the present invention.

FIG. 18 is a cross-sectional view of a display device according to an exemplary embodiment of the present invention.

Referring to FIG. 18, a display device 4-1 according to an exemplary embodiment of the present invention may be substantially the same as the display device 1 described in more detail above with reference to FIGS. 16 to 17, except for a reinforcing member 610-1 attached to the first support member 500A as well as one surface of the second portion 110B exposed through the opening 510 in a state where the bending portion 110C is bent. Therefore, duplicative descriptions may be omitted below.

Figure 19:
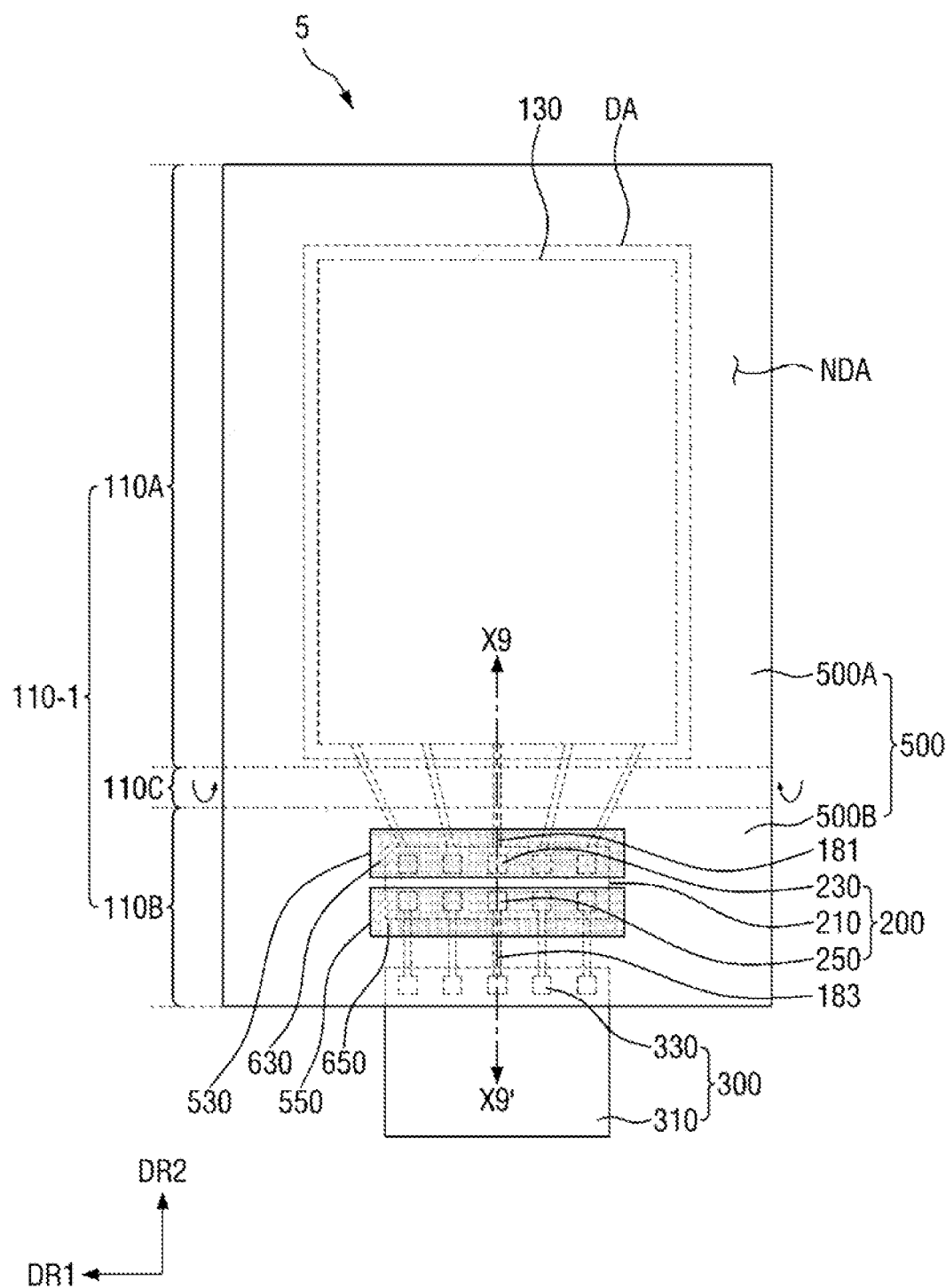
FIG. 19 is a rear view of a display device according to an exemplary embodiment of the present invention.
Figure 20:
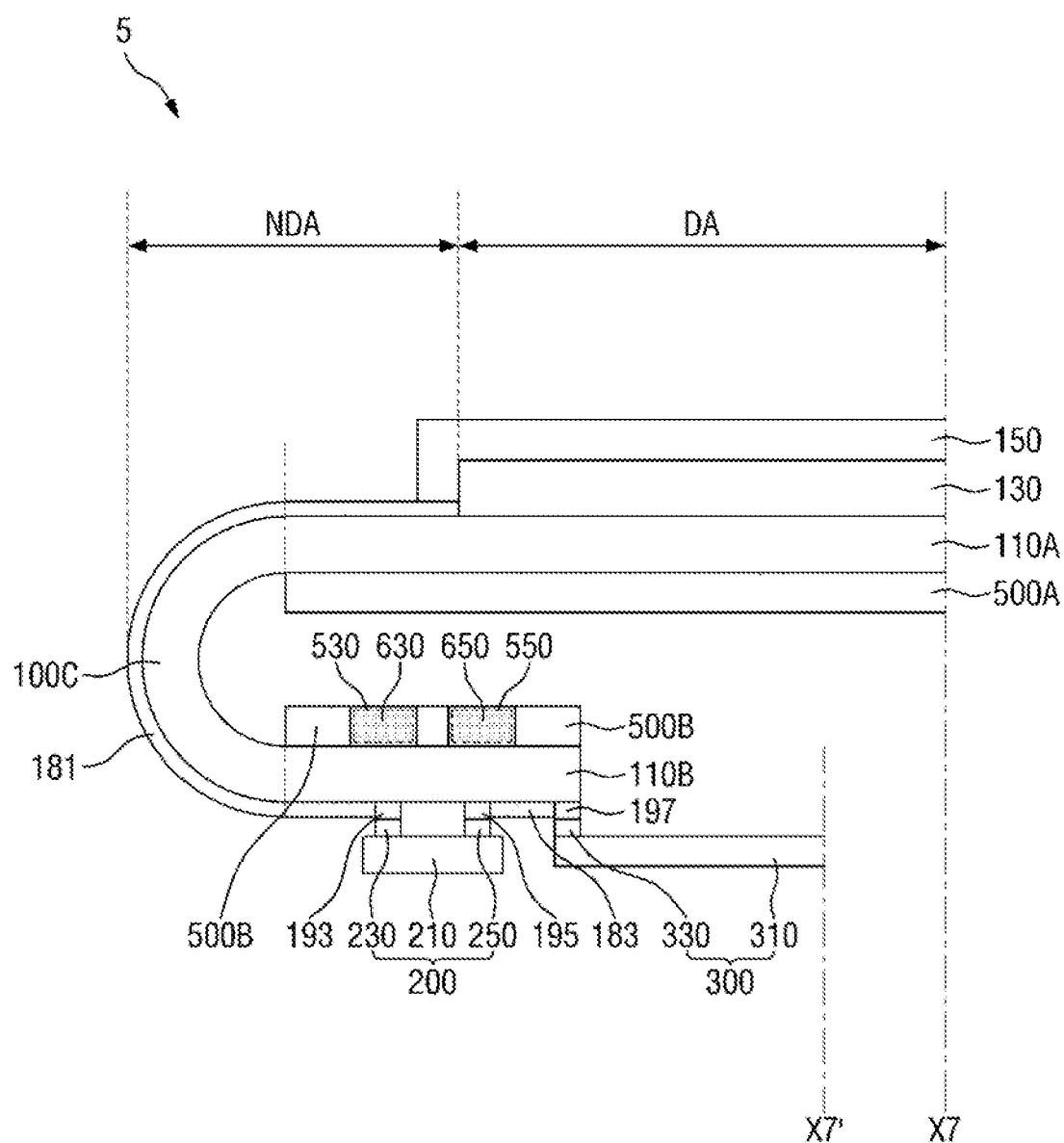
FIG. 20 is a cross-sectional view taken along the line X9-X9' in FIG. 19 of the display device of FIG. 19 in a bent state.

FIG. 19 is a rear view of a display device according to an exemplary embodiment of the present invention. FIG. 20 is a cross-sectional view taken along the line X9-X9' in FIG. 19 of the display device of FIG. 19 in a bent state.

Referring to FIGS. 19 and 20, a display device 5 according to an exemplary embodiment of the present invention may be substantially the same as the display device 1 described in more detail above with reference to FIGS. 10 to 11, except for a flexible base layer 110-1 including the bending portion 110C. Therefore, duplicative descriptions may be omitted below.

A first reinforcing member 630 may be disposed in the first opening 530 of the second support member 500B, and a second reinforcing member 650 may be disposed in the second opening 550 thereof. The first reinforcing member 630 and the second reinforcing member 650 may overlap the first portion 110A and the first support member 500A in a state where the bending portion 110C is bent. In an exemplary embodiment of the present invention, the first reinforcing member 630 and the second reinforcing member 650 may be in direct contact with the lower surface of the second portion 110B, for example, the surface of the second portion 110B facing the lower surface of the first portion 110A in the bending state, and may be spaced apart from the first support member 500A.

Figure 21:
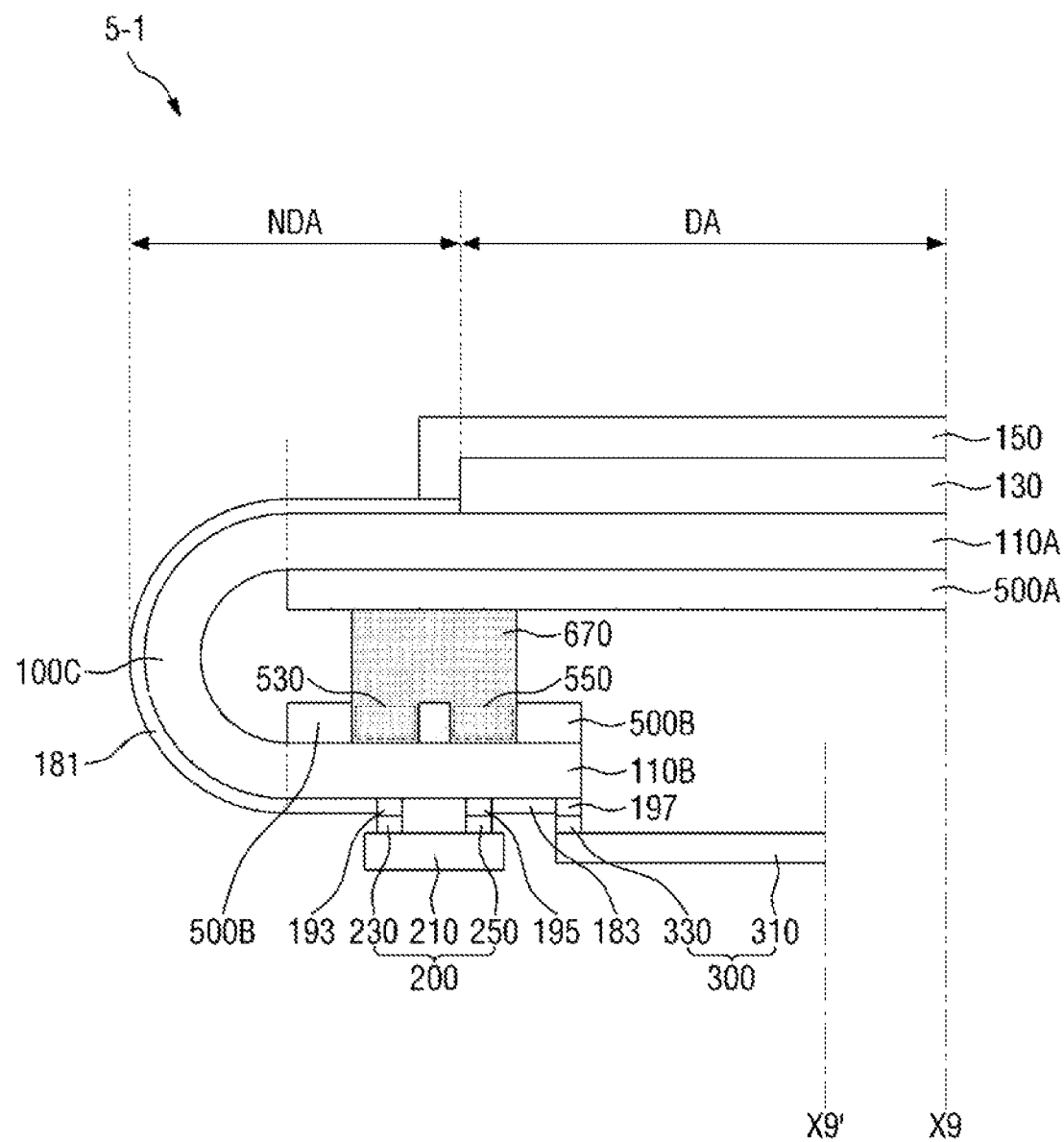
FIG. 21 is a cross-sectional view of a display device according to an exemplary embodiment of the present invention.

FIG. 21 is a cross-sectional view of a display device according to an exemplary embodiment of the present invention.

Referring to FIG. 21, a display device 5-1 according to an exemplary embodiment of the present invention may be substantially the same as the display device 1 described in more detail above with reference to FIGS. 19 to 20, except for a reinforcing member 670 coupled with the first support member 500A and one surface of the second portion 110B exposed through the first opening 530 and the second opening 550 in the state where the bending portion 110C is disposed. Therefore, duplicative descriptions may be omitted below.

The reinforcing member 670 may be coupled with the second portion 110B and the first support member 500A. In an exemplary embodiment of the present invention, the reinforcing member 670 may include an adhesive tape, such as a foam tape.

The reinforcing member 670 may have a structure having portions separated from each other. For example, a part of the reinforcing member 670 may be coupled with the first support member 500A and the second portion 110B exposed through the first opening 530, the other part of the reinforcing member 670 may be coupled with the first support member 500A and the second portion 110B exposed through the second opening 550, and the one part and the other part may be spaced apart from each other.

Figure 22:
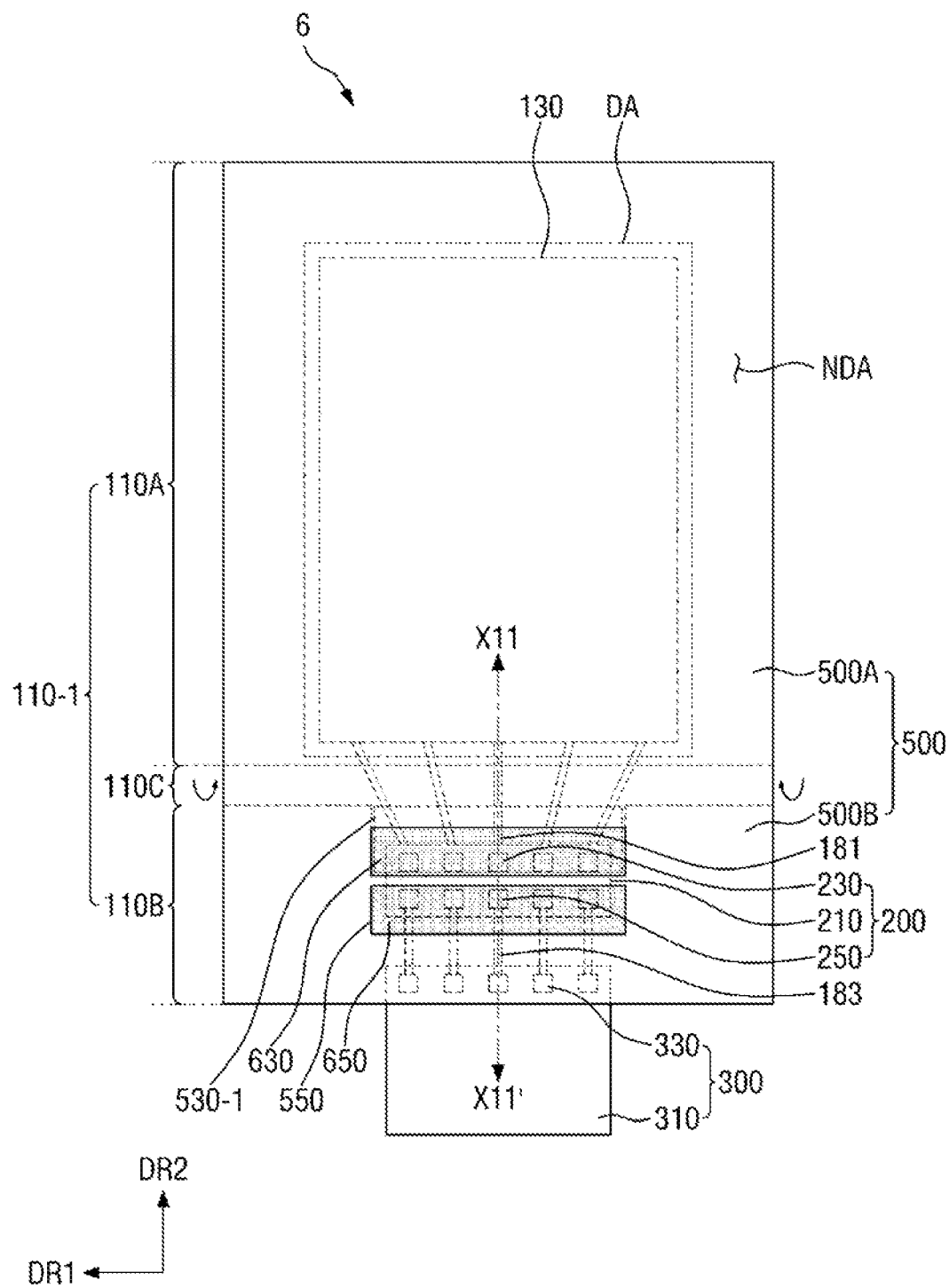
FIG. 22 is a rear view of a display device in an unbent state according to an exemplary embodiment of the present invention.
Figure 23:
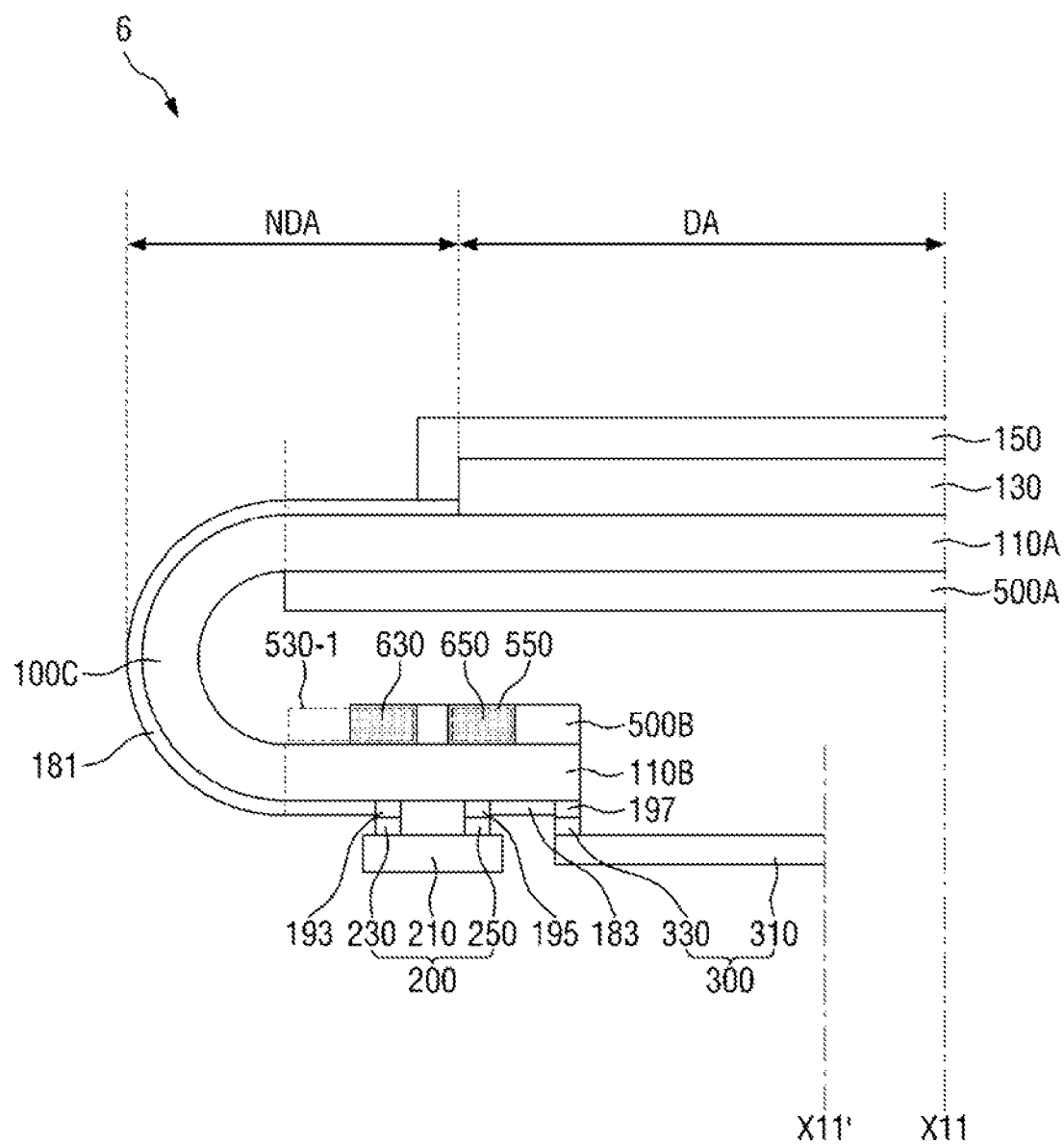
FIG. 23 is a cross-sectional view taken along the line X11-X11' in FIG. 22 of the display device of FIG. 22 in a bent state.

FIG. 22 is a rear view of a display device in an unbent state according to an exemplary embodiment of the present invention. FIG. 23 is a cross-sectional view taken along the line X11-X11' in FIG. 22 of the display device of FIG. 22 in a bent state.

Referring to FIGS. 22 and 23, a display device 6 according to an exemplary embodiment of the present invention may be substantially the same as the display device 1 described in more detail above with reference to FIGS. 19 to 20, except for the shape of a first opening 530-1. Therefore, duplicative descriptions may be omitted below.

The first opening 530-1 formed in the second support member 500B may have a shape in which one side is open.

For example, one side of the first opening 530-1 may be open toward a space between the first support member 500A and the second support member 500B. As an example, the first opening 530-1 may be connected to the space between the first support member 500A and the second support member 500B.

The first reinforcing member 630 may be disposed in the first opening 530-1. In an exemplary embodiment of the present invention, the first reinforcing member 630 may fill only a portion of the first opening 530-1, the portion overlapping the driving circuit 200 and the first pad, without filling the entire first opening 530-1. However, exemplary embodiments of the present invention are not limited thereto. In an exemplary embodiment of the present invention, the reinforcing member 630 may fill the entire first opening 530-1.

Figure 24:
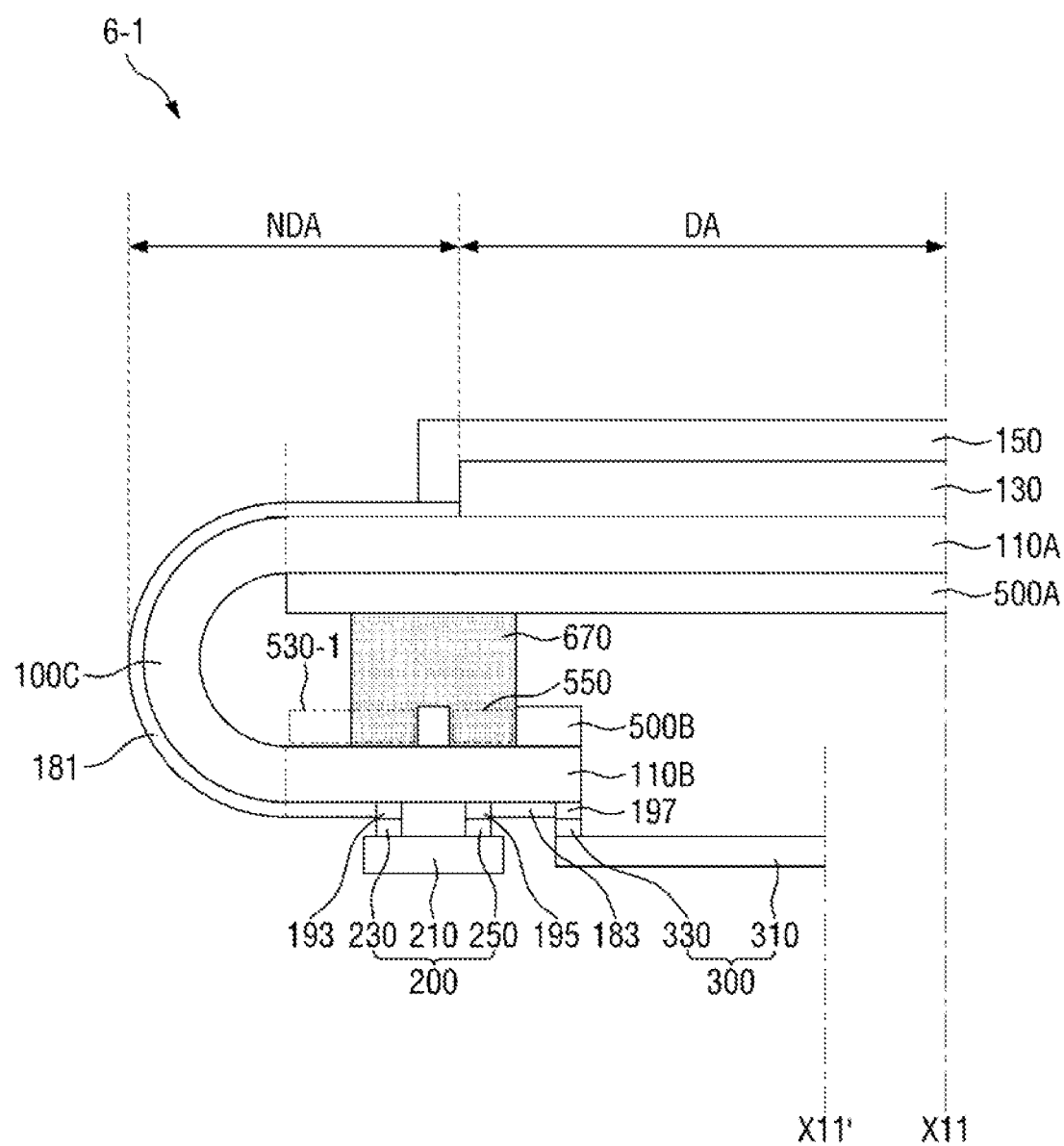
FIG. 24 is a cross-sectional view of a display device according to an exemplary embodiment of the present invention.

FIG. 24 is a cross-sectional view of a display device according to an exemplary embodiment of the present invention.

Referring to FIG. 24, a display device 6-1 according to an exemplary embodiment of the present invention may be substantially the same as the display device 1 described in more detail above with reference to FIGS. 22 to 23, except for a reinforcing member 670 coupled with the first support member 500A and one surface of the second portion 110B exposed through the first opening 530 and the second opening 550 in the state where the bending portion 110C is disposed. Therefore, duplicative descriptions may be omitted below.

According to an exemplary embodiment of the present invention, a display device is provided in which the area of a non-display area is reduced.

Further, according to an exemplary embodiment of the present invention, a display device is provided having increased reliability.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device, comprising:
   a flexible base layer including a first portion and a second portion adjacent to the first portion;
   a display unit disposed on a first surface of the first portion and including a light emitting element;
   a driving circuit disposed on a first surface of the second portion and including a driving chip;
   a first support member disposed on a second surface of the first portion, wherein the second surface of the first portion is on an opposite side of the first portion from the first surface of the first portion;

a second support member disposed on a second surface of the second portion and including a first opening overlapping the driving circuit, wherein the second surface of the second portion is on an opposite side of the second portion from the first surface of the second portion; and a first reinforcing member disposed in the first opening and including a different material from the second support member, wherein a hardness of the first reinforcing member is higher than a hardness of the second support member.

2. A display device, comprising:

a flexible base layer including a first portion and a second portion adjacent to the first portion;

a display unit disposed on a first surface of the first portion and including a light emitting element;

a driving circuit disposed on a first surface of the second portion and including a driving chip;

a first support member disposed on a second surface of the first portion, wherein the second surface of the first portion is on an opposite side of the first portion from the first surface of the first portion;

a second support member disposed on a second surface of the second portion and including a first opening overlapping the driving circuit, wherein the second surface of the second portion is on an opposite side of the second portion from the first surface of the second portion;

a first reinforcing member disposed in the first opening and including a different material from the second support member; and a first pad disposed on the second portion, wherein the driving circuit includes a first terminal disposed between the driving chip and the first pad, and wherein the first terminal is in direct contact with the first pad.

3. The display device of claim 2, wherein the first opening overlaps the first pad.

4. The display device of claim 2, wherein the first terminal includes a first terminal region not including a first conductive material included in the first pad and including a second conductive material different from the first conductive material and a second terminal region including the first conductive material and the second conductive material.

5. The display device of claim 2, further comprising:

a second pad disposed on the second portion and spaced apart from the first pad, wherein the driving circuit includes a second terminal disposed between the driving chip and the second pad, wherein the second terminal is in direct contact with the second pad.

6. The display device of claim 5, wherein the first opening overlaps the first pad and the second pad.

7. The display device of claim 5, further comprising:

a second reinforcing member including a different material from the second support member, wherein the second support member includes a second opening overlapping the second pad and spaced apart from the first opening, and the second reinforcing member is disposed in the second opening.

8. A display device comprising:

a flexible base layer including a first portion and a second portion adjacent to the first portion;

a display unit disposed on a first surface of the first portion and including a light emitting a driving circuit dispose d on a first surface of the second portion and including a driving chip;

a first support member disposed on a second surface of the first portion wherein the second surface of the first portion is on an opposite side of the first portion from the first surface of the first portion;

a second support member disposed on a second surface of the second portion and including a first opening overlapping the driving circuit, wherein the second surface of the second portion is on an opposite side of the second portion from the first surface of the second portion; and a first reinforcing member disposed in the first opening and including different material from the second support member;

wherein the flexible base layer further includes a bending portion disposed between the first portion and the second portion, and a lower surface of the bending portion is spaced apart from the first support member and the second support member, wherein the first reinforcing member is in direct contact with the second portion, and wherein the first reinforcing member is in direct contact with the first portion and the first support member.

9. The display device of claim 8, wherein the first reinforcing member is in direct contact with the first support member.

10. The display device of claim 8, further comprising:

a circuit board attached to the second portion, wherein the circuit board overlaps the first portion.

11. The display device of claim 10, wherein the circuit board overlaps the display unit.

12. A display device, comprising:

a flexible base layer including a first portion and a second portion adjacent to the first portion;

a display unit disposed on the first portion;

a first pad disposed on the second portion and including a first conductive material; and a driving circuit including a driving chip disposed on the second portion and a first terminal disposed between the driving chip and the first pad and including a second conductive material different from the first conductive material, wherein the first pad and the first terminal are in direct contact with each other, and wherein the first pad includes a first pad region including the first conductive material and not including the second conductive material and a second pad region disposed between the first pad region and a contact interface between the first pad and the first terminal, wherein the second pad region includes the first conductive material and the second conductive material.

13. The display device of claim 12, wherein the first terminal includes a first terminal region including the second conductive material and not including the first conductive material and a second terminal region disposed between the first terminal region and the contact interface and including the first conductive material and the second conductive material.

14. The display device of claim 12, further comprising:

a first support member attached to a lower surface of the first portion; and a second support member attached to a lower surface of the second portion and including a first opening formed in a portion of the second support member overlapping the first pad.

15. The display device of claim 14, further comprising:
a reinforcing member disposed in the first opening and in direct contact with the second portion exposed through the first opening,
wherein the reinforcing member includes a different material from the second support member.

16. The display device of claim 14, further comprising:
a second pad disposed on the second portion and spaced apart from the first pad,
wherein the driving circuit further includes a second terminal disposed between the driving chip and the second pad and in direct contact with the second pad, and
the second support member includes a second opening overlapping the second pad and spaced apart from the first opening.

17. The display device of claim 16, further comprising:
a first reinforcing member disposed in the first opening and in direct contact with the second portion exposed through the first opening; and
a second reinforcing member disposed in the second opening and in direct contact with the second portion exposed through the second opening,
wherein each of the first reinforcing member and the second reinforcing member includes a different material from the second support member.

18. The display device of claim 14,
wherein the flexible base layer further includes a bending portion between the first portion and the second portion, and
a lower surface of the bending portion does not overlap the first support member or the second support member.

* * * * *